US 9,503,663 B2

(12) United States Patent
Etoh et al.

(10) Patent No.: US 9,503,663 B2
(45) Date of Patent: Nov. 22, 2016

(54) SOLID-STATE IMAGING APPARATUS

(71) Applicant: Takeharu Etoh, Osaka (JP)

(72) Inventors: Takeharu Etoh, Osaka (JP); Tetsuo Yamada, Kanagawa (JP); Dao Vu Truong Son, Osaka (JP)

(73) Assignee: Takeharu Etoh, Osaka (JP)

( * ) Notice: Subject to any disclaimer, the term of this patent is extended or adjusted under 35 U.S.C. 154(b) by 4 days.

(21) Appl. No.: 14/467,605

(22) Filed: Aug. 25, 2014

(65) Prior Publication Data

US 2014/0362268 A1  Dec. 11, 2014

(30) Foreign Application Priority Data

Feb. 29, 2012  (JP) ................................. 2012-062673
May 17, 2012  (JP) ................................. 2012-128368

(51) Int. Cl.
*H04N 5/3745*  (2011.01)
*H04N 5/374*  (2011.01)
(Continued)

(52) U.S. Cl.
CPC ...... *H04N 5/37452* (2013.01); *H01L 27/1464* (2013.01); *H01L 27/14812* (2013.01);
(Continued)

(58) Field of Classification Search
CPC ................. H04N 5/3696; H04N 5/372; H04N 5/37213; H04N 5/3742; H04N
(Continued)

(56) References Cited

U.S. PATENT DOCUMENTS 5,355,165 A * 10/1994 Kosonocky ....... H01L 27/14806
257/E27.151
6,118,483 A *  9/2000 Etoh .................... H04N 3/1525
348/315
(Continued)

FOREIGN PATENT DOCUMENTS

JP   2001-53260    2/2001
JP   2004-214363   7/2004
(Continued)

OTHER PUBLICATIONS

International Search Report issued Apr. 2, 2013 in International (PCT) Application No. PCT/JP2013/055364.
(Continued)

*Primary Examiner* — Daniel M Pasiewicz
(74) *Attorney, Agent, or Firm* — Wenderoth, Lind & Ponack, L.L.P.

(57) ABSTRACT

A solid-state imaging apparatus allows precise observation and analysis of ultra-high-speed phenomena at a frame rate more than 100 Mega frames per second, which has been targeted in advanced science and engineering. The solid-state imaging apparatus comprises pixels arranged in M columns and N rows. Each pixel includes a first layer for photoelectric conversion and a second layer having m charge collection devices, where m is equal to or greater than 3, for collecting and storing charges generated light incident on a substantially whole area of the pixel, and a readout device for reading out the charges, where m charge collection devices are locally placed in an area around a center of the pixel. The second layer further includes a second storage device for storing the charges collected and stored by each of the collection devices.

7 Claims, 34 Drawing Sheets

(51) Int. Cl.
- *H01L 27/148* (2006.01)
- *H01L 27/146* (2006.01)
- *H04N 5/369* (2011.01)
- *H04N 5/372* (2011.01)

(52) U.S. Cl.
CPC ...... *H01L 27/14831* (2013.01); *H04N 5/3696* (2013.01); *H04N 5/372* (2013.01); *H04N 5/3742* (2013.01); *H04N 5/37213* (2013.01)

(58) Field of Classification Search
CPC ............... 5/37452;H01L 27/14812; H01L 27/1464; H01L 27/14831
See application file for complete search history.

(56) References Cited

U.S. PATENT DOCUMENTS

| | | | | |
|---|---|---|---|---|
| 6,661,463 | B1 * | 12/2003 | Geshwind | H04N 5/843 348/384.1 |
| 6,972,795 | B1 * | 12/2005 | Etoh | H01L 27/14806 257/E27.151 |
| 7,091,530 | B1 * | 8/2006 | Reich | H01L 27/14812 257/213 |
| 7,176,972 | B2 * | 2/2007 | Mutoh | H01L 27/14812 257/E27.152 |
| 7,808,536 | B2 * | 10/2010 | Yamada | H04N 5/232 250/208.1 |
| 8,004,589 | B2 * | 8/2011 | Obara | H01L 27/14806 348/294 |
| 8,576,319 | B2 * | 11/2013 | Kureta | H04N 5/3592 348/282 |
| 2007/0285544 | A1 | 12/2007 | Yamada et al. | |
| 2008/0106625 | A1 * | 5/2008 | Border | H04N 5/35572 348/296 |
| 2009/0250777 | A1 | 10/2009 | Takamiya | |
| 2009/0250779 | A1 | 10/2009 | Hirose et al. | |
| 2009/0262215 | A1 | 10/2009 | Sano et al. | |
| 2012/0112255 | A1 | 5/2012 | Kondo et al. | |
| 2012/0182540 | A1 | 7/2012 | Suzuki et al. | |

FOREIGN PATENT DOCUMENTS

| | | |
|---|---|---|
| JP | 2006-269612 | 10/2006 |
| JP | 2007-329722 | 12/2007 |
| JP | 2008-66937 | 3/2008 |
| JP | 2009-252973 | 10/2009 |
| JP | 2009-252983 | 10/2009 |
| JP | 2011-35382 | 2/2011 |
| JP | 2011-133464 | 7/2011 |

OTHER PUBLICATIONS

Takeharu Etoh et al., "An In-situ Storage Image Sensor of 1,000,000 fps with Slanted Linear CCD Storage", ITE Journal, vol. 56, No. 3, pp. 483-486 (2002).
Takeharu Etoh et al., "Back-side Illuminated Image Sensor of 16,000,000 fps", ITE Journal, vol. 65, No. 3, pp. 349-353 (2011).
Yasuhisa Tochigi et al., "A Global-Shutter CMOS Image Sensor with Readout Speed of 1Tpixel/s Burst and 780 Mpixel/s Continuous", ITE Technical Report, vol. 36, No. 18, pp. 9-12 (2012).
Hisashi Watanabe et al., "A 1.4μmFSI sensor with novel light guiding structure consisting of stacked lightpipes", ITE Technical Report, vol. 36, No. 18, pp. 37-40 (2012).

* cited by examiner

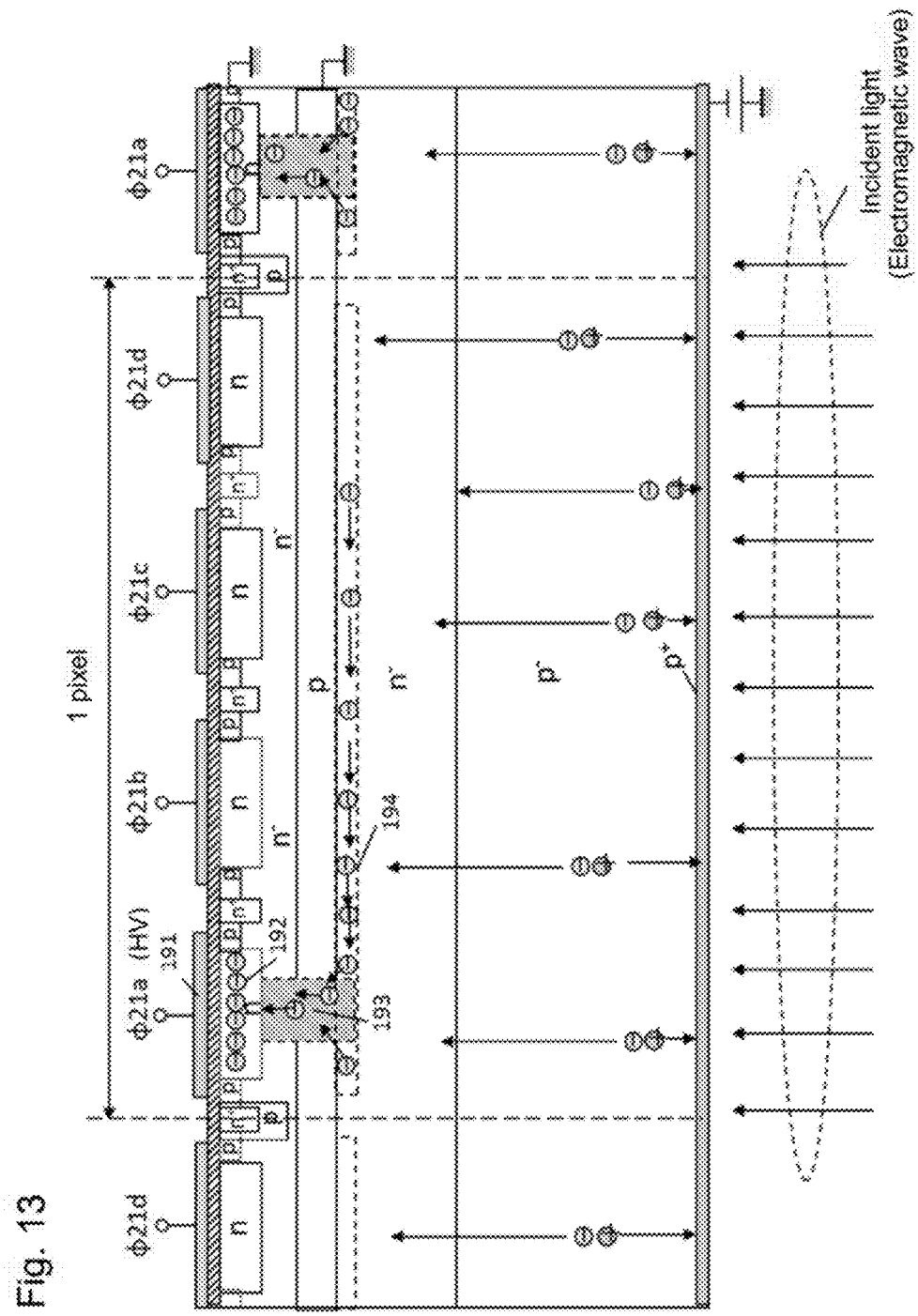

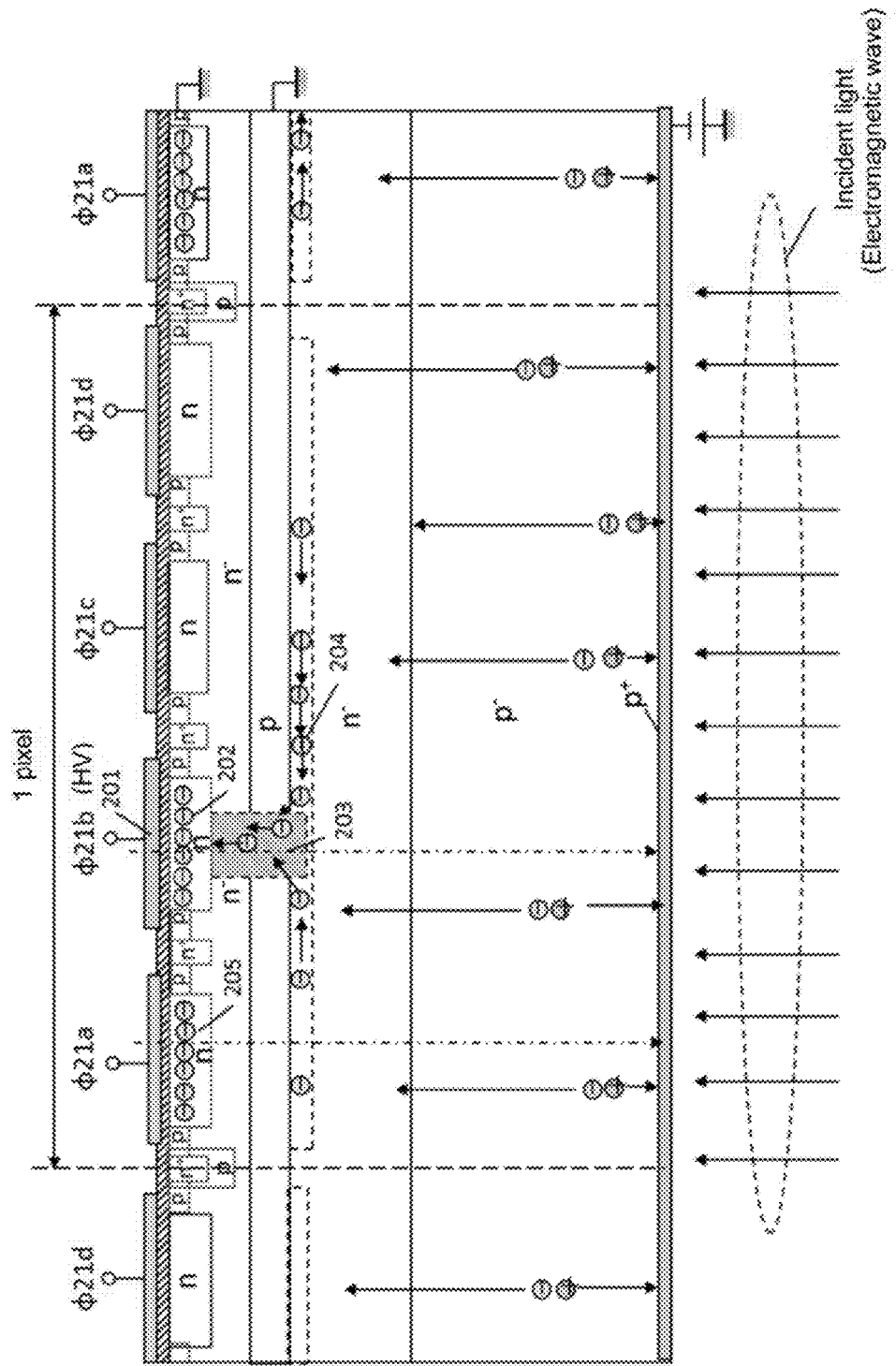

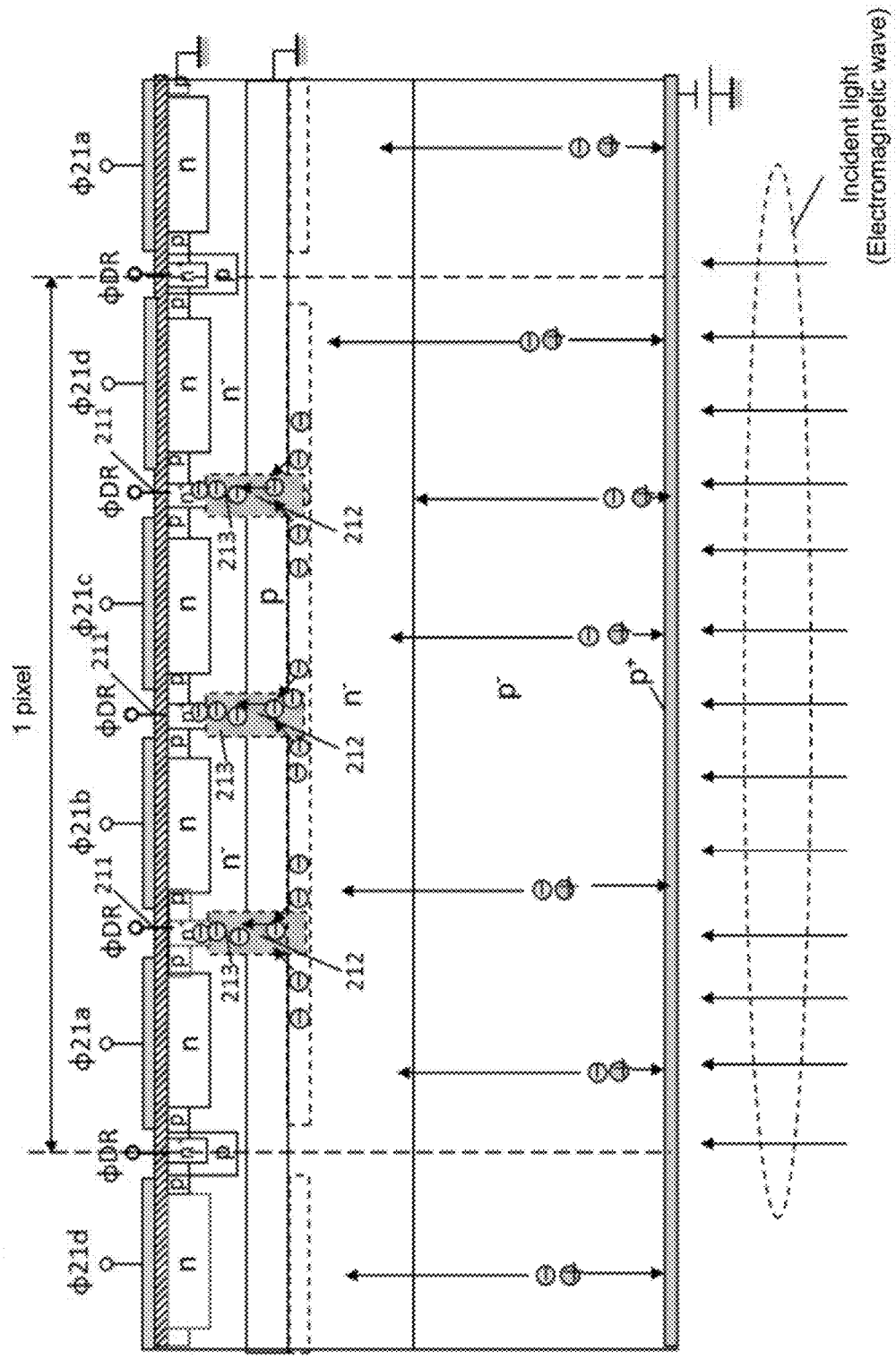

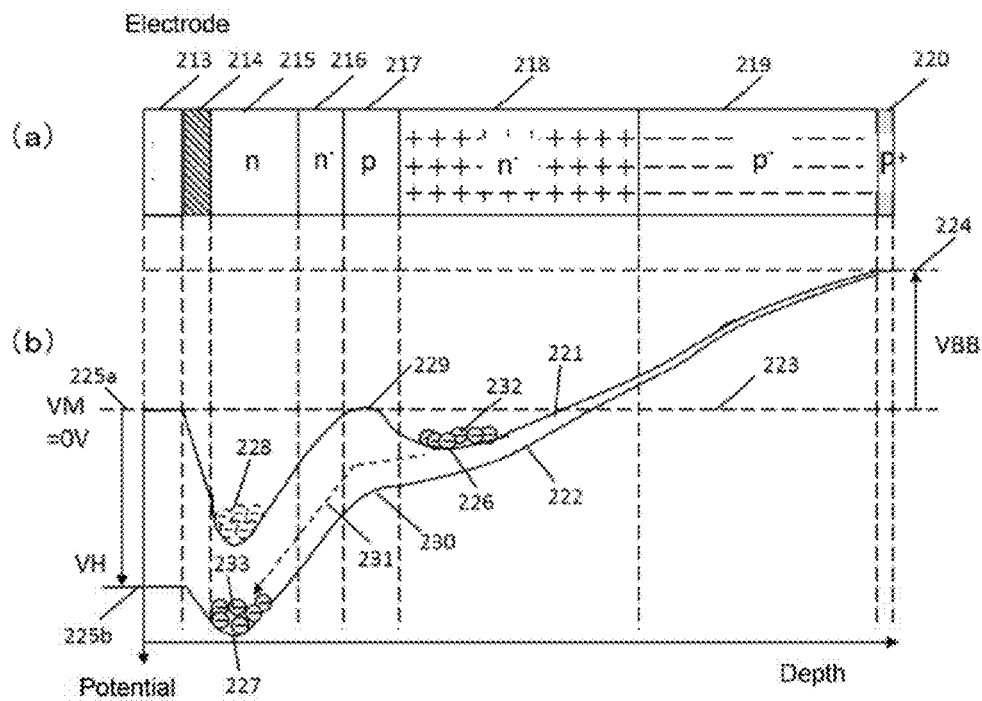
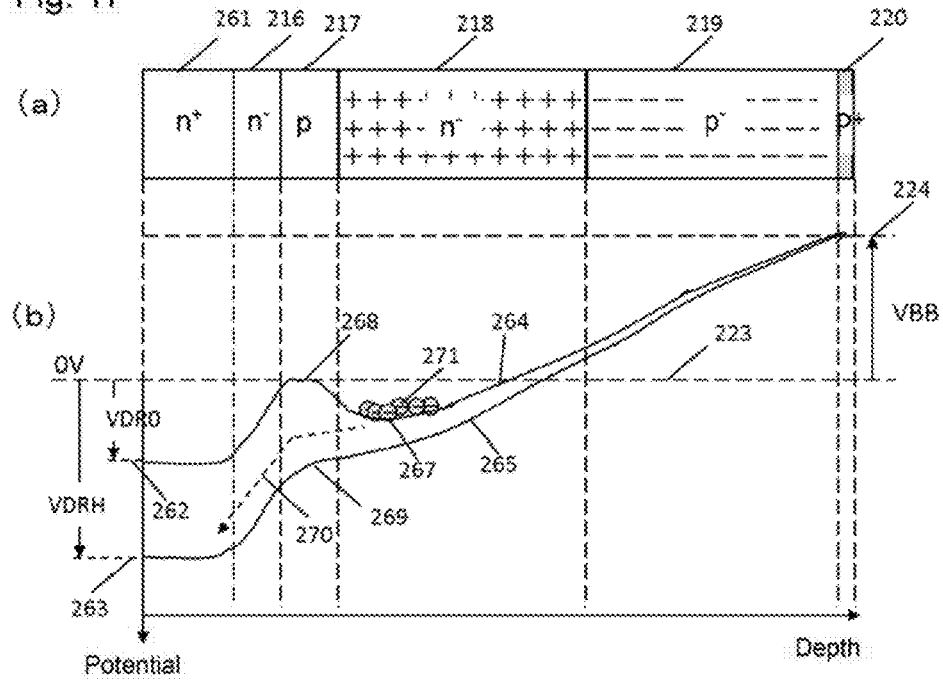

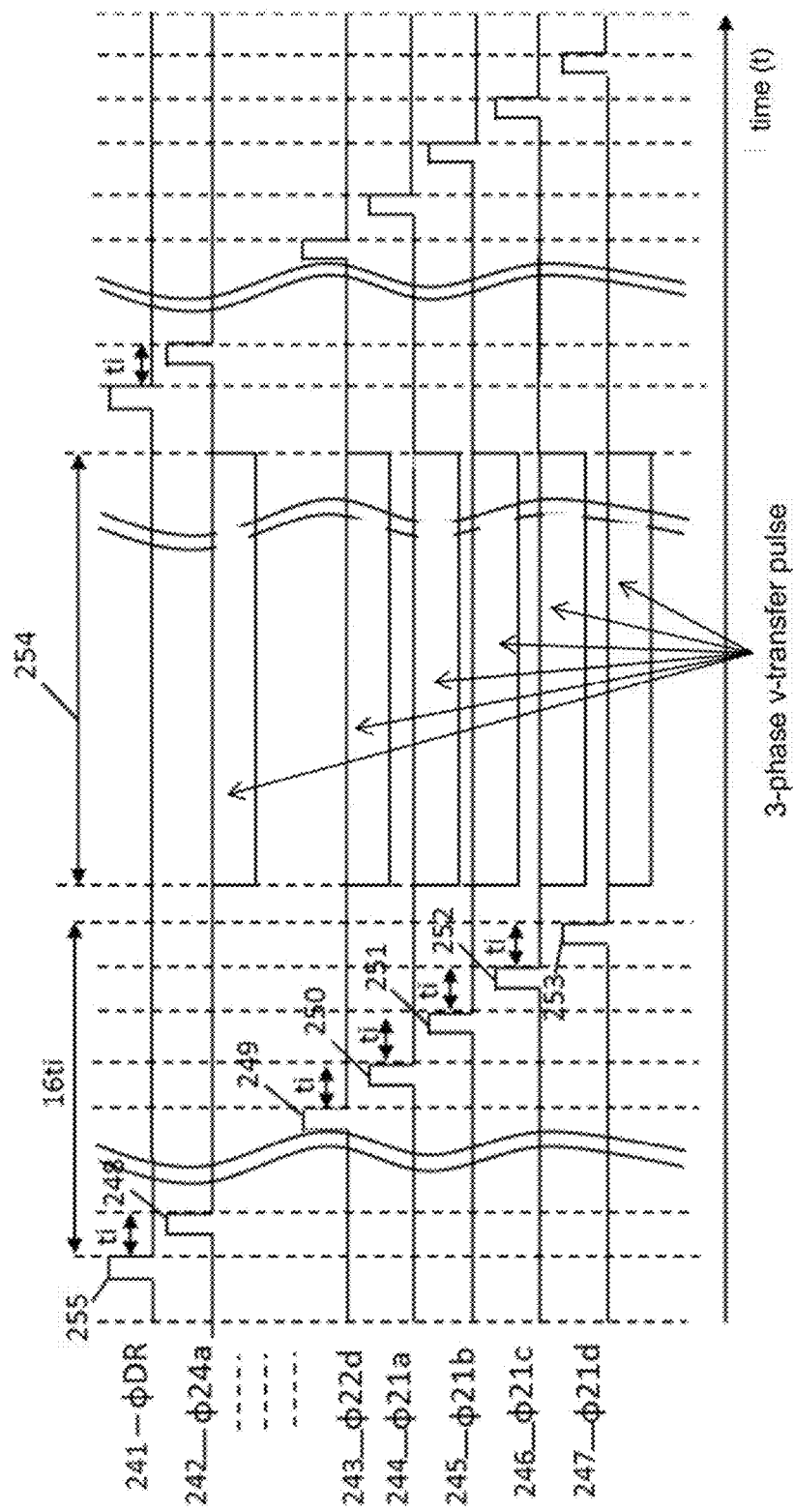

Fig. 30
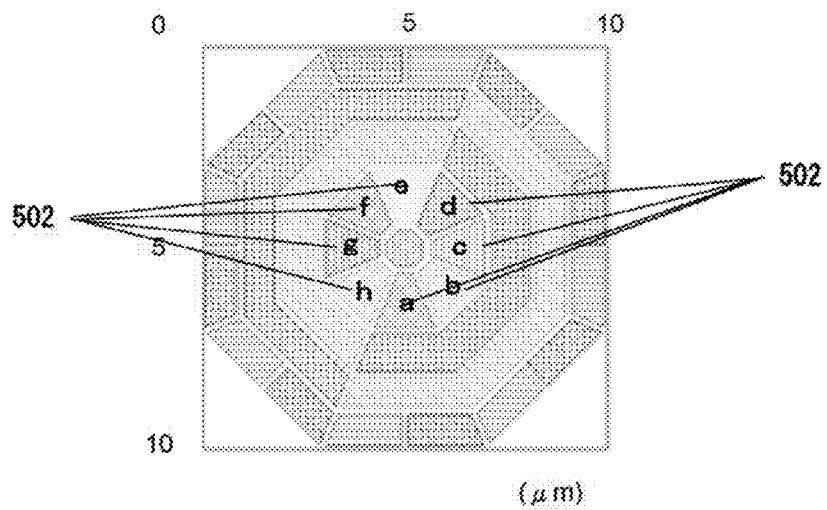
Fig. 31
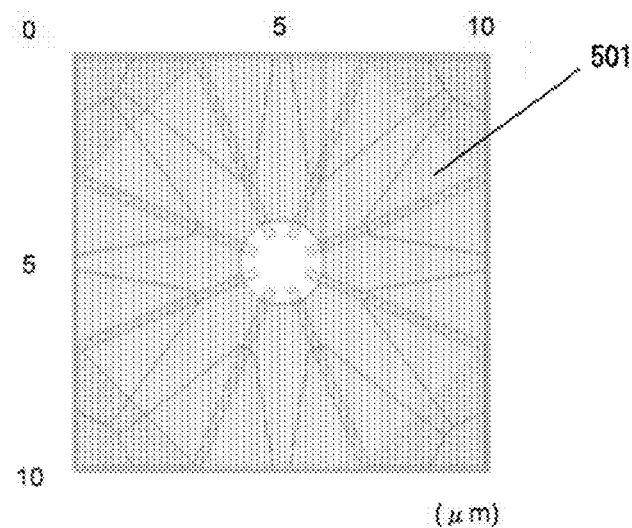
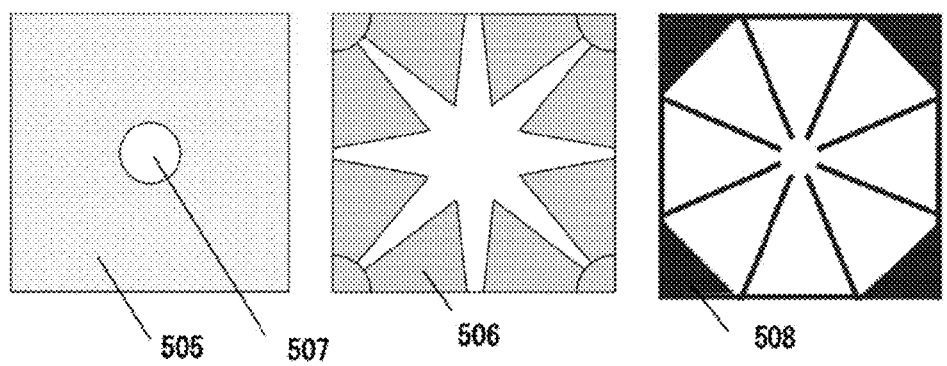

SOLID-STATE IMAGING APPARATUS

CROSS-REFERENCE TO RELATED APPLICATIONS

This is a continuation application of International Application No. PCT/JP2013/055364, with an international filing date of Feb. 28, 2013, which claims priority of Japanese Patent Applications No.: 2012-062763 filed on Feb. 29, 2012 and No.: 2012-128368 filed on May 5, 2012, the contents of which are incorporated herein by reference.

BACKGROUND

This invention is related to an architecture and an operation of a solid state imaging apparatus, particularly to a solid state imaging apparatus and a system for capturing a plurality of frames at an ultra-high frame rate.

T. Etoh et al., An in-situ storage image sensor of 1,000,000 fps with slanted linear CCD storage, J. of the Institute of Image Information and Television Engineers, 65(3), 483-486, 2002, in Japanese discloses a technique with which a plurality of analogue CCD memories are installed in each pixel to capture images at a high frame rate. T. Etoh, et al., Backside Illuminated Image Sensor of 16,000,000 fps, 65(3), 349-353, 2011, in Japanese discloses an improved technique applied to a backside illumination structure to significantly increase the sensitivity by avoiding wasting incident light in photoelectric conversion. An ultra-high-speed video camera with an image sensor of 165,000 pixels operating at 16,000,000 frames per second (fps) was developed with this technology.

FIG. 1 is a partial plane view of the imaging apparatus disclosed in T. Etoh et al., An in-situ storage image sensor of 1,000,000 fps with slanted linear CCD storage, J. of the Institute of Image Information and Television Engineers, 65(3), 483-486, 2002, in Japanese, and FIG. 2 is a cross-section view of the backside illumination structure disclosed in T. Etoh, et al., Backside Illuminated Image Sensor of 16,000,000 fps, 65(3), 349-353, 2011, in Japanese. Hereafter, an operation mode of the background technology is briefly explained.

A signal charge collection part 1 in FIG. 1 collects and stores signal charges, transfers the signal charges to an element of an analogue CCD memory 2, and then waits for the timing at which the next frame is captured. The time required for these steps is represented by ti. The analogue CCD memory 2 is equipped with k transfer elements. When a signal charge packet is transferred from the signal charge collection part to the analogue CCD memory, signal charge packets are transferred by one stage of the analogue CCD memory in the direction shown with arrows in the figure. After the duration ti elapses, a next signal charge packet is transferred to the analogue CCD memory, and the signal charge packets stored in the analogue CCD memory are transferred by one stage of the memory in the direction of the arrows.

By repeating the operation k times, all elements of the analogue CCD memory 2 are filled with the signal charge packets with the time interval ti. The last element of the analogue CCD memory 2 is connected to a vertical readout CCD 3 (vertical analogue memory) through a connection gate 8. Then, a combined signal transfer operation of the analogue CCD memory and the vertical readout CCD 3 starts.

The number of elements of the vertical readout CCD memory connected to one analogue CCD memory is represented by j. Then, (k+j) signal charge packets with the interval of ti are finally stored in the analogue CCD memory 2 and the vertical readout CCD 3.

Since every pixel 9 includes the signal charge collection part and the attached analogue CCD memory, the signal charges are simultaneously collected and transferred at all pixels. Since a group of image signal charge packets are recorded simultaneously in all pixels 9 at an interval of ti, the signal charge packets for (k+j) frames (signal charge packets for one frame) with the interval of ti are stored in the imaging apparatus.

In the next step, the vertical readout CCD 3 is operated to transfer the signal charge packets to a horizontal transfer CCD 6 in the direction shown with the arrows. After the horizontal transfer CCD with R elements are filled with the signal charge packets, the signal charge packets are transferred on the horizontal transfer CCD (from right to left in the figure) to an amplifier and a readout circuit 7, and are read out to the outside of the sensor. By repeating the operation, a series of image signals for (k+j) frames with the interval of ti are read out to the outside of the imaging apparatus.

In FIG. 1, a drain 4 discharges excessive charges from the signal charge collection part 1 when the charge collection part receives a large amount of charges, and a gate 5 controls the discharge of the excessive charges to the drain 4.

FIG. 2 is a cross-section view 10 of the backside illumination structure to explain a photoelectric conversion process and a signal charge collection process. The figure illustrates a simplified cross section along a horizontal line from a signal charge collection part to an analogue CCD memory. On a front side of a semiconductor chip made of Si, signal charge collection parts 11, collection control electrodes 12, analogue CCD memories 13, transfer electrodes of the CCD 14, n-type CCD channels 15, and channel separations 16 are formed. Hereafter, an electrode of the signal charge collection part is also referred to as a charge collection electrode or a collection electrode.

A high-concentration p-layer 20 is formed near the backside of the Si chip. The bulk of the chip includes a low-concentration p-layer 19 and a low-concentration n-layer 18 forming a junction, which is kept under a strong reverse-bias state. Therefore, as the carriers are withdrawn to the outside of the bulk, the bulk is substantially depleted, which creates an electric field toward the backside from the front side. Photons (electromagnetic waves) 21 incident on the backside of the Si are converted to a pair of electrons and holes. The signal electrons and the holes are attracted respectively to the front side and the backside by the field. The holes are discharged to the high-concentration p-layer at the backside and to the outside of the chip.

To prevent electrons attracted to the front side from migrating to the analogue CCD memory, a p-well 17 is formed as a p-well barrier layer. The structure enables collection of practically all electrons generated by the photoelectric conversion to the signal charge collection part 11. Time required for collection of an electron in the process is less than several nanoseconds. The time can be reduced to about one nanosecond.

The frame rate (the number of frames per second) of conventional high-speed imaging devices illustrated in FIG. 1 is the inverse of the frame interval ti. A technical issue of high-speed imaging apparatuses is how to reduce the frame interval ti.

The frame interval ti in the image capturing using the technology disclosed in the nonpatent literature 1 and 2 is expressed by the following expression (1):

$$ti = tc + tt + tw \quad (1)$$

where tc is a collection time for a signal charge generated by incident light to reach a signal charge collection part, tt is a charge transfer time from the signal charge collection part to an adjacent memory, and tw is a waiting time from completion of capturing and storing image signals of one frame to start of the image capture of the next frame.

The minimum frame interval tm for the highest frame rate is expressed by the following expression (1)' when tw is zero:

$$tm = tc + tt \quad (1)'$$

In the signal charge collection process and the transfer process explained above, the time tc for signal charge generated by incident light to reach the signal charge collection part can be reduced to less than several nanoseconds. On the other hand, the transfer time tt to a CCD element or the transfer time from a CCD element to the next element is more than ten nanoseconds, and practically several tens of nanoseconds.

Therefore, the transfer time tt of the CCD limits the minimum frame interval tm of the frame interval ti. Thus, this invention newly provides a device in which the time tt is reduced or eliminated to further increase the frame rate.

Ultra-high-speed imaging is supported not only by CCD technology. Y. Tochigi et al., A Global-Shutter CMOS image sensor with Readout Speed of 1 Tpixel/s Burst and 780 Mpixel/s Continuous, ITE Technical Report, 36(18), 9-16, 2012, in Japanese discloses an ultra-high-speed image sensor using CMOS circuits and CMOS memories. The imaging device equipped with the image sensor has achieved 10,000,000 fps for spatial resolution of 100,000 pixels.

The image sensor has the following special features:
(1) One hundred analogue memories for each pixel are placed in a peripheral area of the image sensor chip,
(2) A plurality of wires to read out signals are placed on each column of the pixels; the number of the readout wires on each column is I/4, where I is the number of the pixels on the column; image signals captured in all pixels on the column are read out, transferred to the memories on the periphery of the pixel and temporarily recorded in the memories; and, then, the number of the readout operations to read out all image signals from all pixels on the column is only four times the time required to readout one image signal from one pixel,
(3) The capacity of each analogue signal memory element is increased by forming the memory capacitor with a combination of a conventional CMOS capacitor and a capacitor made with overlapped double polysilicon electrodes, and
(4) In addition, the sensor techniques includes new technologies such as a power source circuit installed in each pixel, and a device for noise cancellation.

The charge transfer time tt of this embodiment is also much longer than the charge collection time tc. Therefore, reduction or elimination of the charge transfer time tt is the crucial issue to further achieve a higher frame rate.

Insufficient incident light is a very severe constraint for ultra-high-speed imaging due to an extremely short frame interval. T. Etoh, et al., Backside Illuminated Image Sensor of 16,000,000 fps, 65(3), 349-353, 2011, in Japanese discloses a technology combining the technology disclosed in T. Etoh et al., An in-situ storage image sensor of 1,000,000 fps with slanted linear CCD storage, J. of the Institute of Image Information and Television Engineers, 65(3), 483-486, 2002, in Japanese with a backside illumination structure with almost no change of the circuits. A 100%-fill factor (a ratio of the area of photoreceptive area to the pixel area) can be achieved by this technology.

Furthermore, A 1.4 □m FSI sensor with novel light guiding structure consisting of stacked lightpipes, ITE Technical Report, 36(18), 37-40, 2012, in Japanese discloses a front-side illuminated image sensor to effectively utilize a large portion of light incident on a pixel with a technology combining an on-chip-microlens and a stacked light guide without using backside illumination. Though the image sensor was developed for a usual video camera, the technology can be applied to high-speed image sensors.

SUMMARY

This invention has been made having regard to the state of the art noted above, and its object is to provide a solid-state imaging device that achieves the frame rate more than 100,000,000 fps to enable accurate observation and analysis of ultra-high-speed phenomena required in advanced science and engineering.

Specifically, this invention aims at elimination of the charge transfer time tt that accounts for a major part of the minimum frame interval tm to achieve the theoretical minimum frame interval tm=tc, and the theoretical maximum frame rate 1/tc.

[Sequential collection of signal charges by a plurality of charge collection devices locally placed around a center of a pixel]

Above object is fulfilled, according to this invention, by an imaging apparatus comprising: a semiconductor device; a focusing unit for focusing an incident magnetic wave or an incident charged particle on said semiconductor device; a controller for controlling said semiconductor device; and a signal processing unit for processing a signal output from said semiconductor device, wherein said semiconductor device includes an array of photo-sensitive units arranged in M columns and M rows, where M and N are integers equal to or greater than two, and each of said photo-sensitive units includes
(1) a conversion device for converting the incident magnetic wave or the incident charged particle to J electric charges, wherein J is an integer equal to or greater than zero, and
(2) m sub-units, where m is an integer equal to or greater than three,
wherein each of said m sub-units includes at least one collection device for sequentially and selectively collecting the electric charges and storing the collected electric charges as a charge packet, and a transfer device for transferring the charge packet or a signal resulting from converting the charge packet to an outside of the sub-unit, wherein said every collection device of each of said m sub-units is locally placed around a point in a central area of said photo-sensitive unit.

[A path of an electron from the photoelectric conversion device to the charge collection device is depleted with no intervening element]

Furthermore, during collection of the signal charges by at least one of the charge collection devices, there is no element to delay the signal charges in a path from the photoelectric conversion device to the charge collection device, and the path is depleted so that the signal charges are drifted only with a potential gradient along the path.

[Transfer of signal charges from one of the m charge collection devices during collection of the signal charges by the other (m−1) charge collection devices]

The pixel of the image sensor further includes means for transferring the signal charges from one of the m charge collection devices during collection of the following signal charges by at least two of other charge collection devices.

[The charge collection devices are independently operated and charge transfer devices are commonly operated among a group of the charge collection devices]

The pixel includes m sub-pixel units, each comprising one charge collection device, one signal transfer device and, if necessary other signal control circuits. The sub-pixel units are grouped to m/L groups, where L is equal to or greater than two. The signal charges collected by the charge collection devices belonging to one of the groups are simultaneously transferred during sequential charge collection by the charge collection devices belonging to one of other groups.

In this pixel, all the charge collection devices must be operated independently, while the charge transfer devices of the sub-pixels in each sub-pixel group are commonly operated to simultaneously transfer the signal charges collected by the charge collection devices in the sub-pixel group.

[The signal charge are selectively collected by punching through a potential barrier between the photoelectric conversion device and the charge collection devices]

The image sensor includes an array of pixels, each consisting of a backside illuminated structure provided with a potential barrier layer between the photoelectric conversion device on the backside receiving incident light and the circuit layer on the front side. Signal charges punch through the potential barrier and are collected by one of the charge collection devices by applying a high voltage to the electrode of the charge collection device collecting signal charges (if the signal charges are holes, a lower voltage is applied to the electrode).

In the case of m charge collection devices being locally placed in a central area of each pixel, the concentration creating the potential barrier is lower or zero in the area where the charge collection devices are located.

[A barrier between the photoelectric conversion layer and the circuit layer is made with a silicon oxide layer]

Furthermore, the barrier can be made of an insulation material. Usually, the insulation layer is made of silicon oxide. The signal charges are collected through a hole made in the silicon oxide layer in the area where the charge collection devices are located.

[The charge collection devices are placed on a circle locating in a central area of the pixel and each sub-pixel group is formed in a radially expanding shape]

The group of the sub-pixels are placed to fit to a regular polygon internally contacted to a pixel with the charge collection devices located in a central part of the pixel.

Regular hexagonal pixels can be densely placed on a surface, while a pixel consisting of a regular octagon and a square fills up the surface, wherein circuits commonly used by the sub-pixel units in a pixel are placed in the square.

[Focusing incident light on a central area of each pixel with a light guide]

The photoelectric conversion device at least includes a light guide and a photodiode.

[The signal charges are selectively collected by a plurality of charge collection devices with transistors]

Buried-channel transistors can be used for the selective collection.

[The charge collection device is made with a floating diffusion]

The charge collection device is made of a floating diffusion directly connected to an electrode without an insulation layer.

[Signal charges collected by one charge collection device "A" is transferred to the outside of a during collection of signal charges by the other (m−1) charge collection devices]

As previously explained, a collection time of signal charges from a photoelectric conversion device to a charge collection device is represented by tc, a transfer time of the signal charges from the charge collection device to the outside is represented by tt, a frame interval of consecutive image frames is represented by ti, and the minimum frame interval is represented by tu.

To minimize the frame interval in image capturing of m frames in accordance with this invention, a charge collection device is to be switched to another one at an interval of collection time tc. Then, a frame interval ti=tc=tu, which is the theoretically achievable minimum frame interval. In the case, however, the number of consecutive frames is limited to m.

By transferring signal charges collected by a charge collection device "A" to the outside of A to empty A during collection of signal charges by other (m−1) charge collection devices, A can collect the (m+1)th image signal again. By repeating the operation, image signals for consecutive m(k+1) frames are captured, where k represents the number of image signal memories belonging to a sub-pixel unit and locating at either inside or outside of the sub-pixel unit. The additional number of frames represented by (+1) explains that image signals are stored also in the m charge collection devices.

For example, if m=8, since the time required for collection of signal charges by charge collection device A is tc, the collection time for the remaining seven charge collection devices is 7 tc. If the signal charge collected by A can be transferred during 7 tc, A can collect new signal charges again. Namely, if 7 tc is equal to or greater than tt, since the transfer of the signal charges in A has been completed, the new signal charges can be collected by the empty A again.

For example, if the collection time is 5 nanoseconds and the transfer time is less than 35 nanoseconds, at 35 nanoseconds after collection of the first signal by the charge collection device A, the charge collection device A is empty and can collect the ninth signal by using 5 nanoseconds. For example, if k=4, the sensor can capture 40 (=8(4+1)) frames at the frame interval tc=5 nanoseconds. The frame rate of this operation is 1/tc=200,000,000 fps.

On the other hand, if 7 tc is less than tt, the next signal charge can be captured after ti=tt+tc. For example, if tt=45 nanoseconds, since eight consecutive images can be captured at each (tt+tc)=50 nanoseconds, the frame interval is (tt+tc)/8=6.25 nanoseconds and the frame rate is 160,000,000 fps, which is still ten times higher than 16,000,000 fps, the highest frame rate ever achieved in the world disclosed in the nonpatent literature 2. In practice, tc<<tt.

For the meantime, only to increase the frame interval, it is possible for a conventional image sensor to capture four consecutive frames at the frame interval tc by repeating an operation in which only one pixel "A" in a macro-pixel defined by a group of four neighboring pixels collects signal charges during one frame interval tc and discharges the charges to a drain during the next three frame intervals 3 tc to avoid overlap of the consecutive image signals, and the other three pixels perform the same operation in turn. It is also possible to transfer a signal charge packet collected in A to memories in or outside of the pixel during collection signal charges by other three pixels.

In the operation, however, a photoreceptive area of the macro-pixel during capturing one frame is equal to a photoreceptive area of the elemental one pixel which is a quarter of the photoreception area of the macro-pixel. Therefore, the fill factor of the macro-pixel under this sequential operation is equal to or less than a quarter of the original fill factor. Therefore the sensitivity of the macro-pixel under this operation is equal to or less than a quarter of the sensitivity of the macro-pixel capturing an image at once. In ultra-high-speed imaging, insufficient sensitivity is critical.

On the other hand, sequential collection of the signal charges generated by light incident on a whole pixel area by m charge collection devices in each pixel, where m is equal to or larger than three, makes the fill factor equal to or more than 80%, enabling ultra-high-speed imaging with a very high sensitivity.

[The charge collection devices are independently operated and a group of the charge transfer devices are commonly operated]

For example, the m charge collection devices in a pixel are split to two groups X and Y, wherein each of X and Y has one transfer device; signal charges (or image signals) collected sequentially by the charge collection devices belonging to X are simultaneously transferred during collection by the charge collection devices belonging to Y. This operation requires m wires to control the charge collection devices and two wires to control the transfer devices. Therefore, the number of the wires to control charge transfer and temporal storage reduces from m to 2. This circuit configuration reduces the number of wires on a pixel, and, therefore, the pixel size, while the frame rate is increased by the simultaneous transfer of the signal charge packets in X (or Y) during the sequential collection in Y (or X).

The operation, however, reduces the time available for transferring the signal charges to m/2 times tc, while the time available for transferring the signal charges collected by one of charge collection devices during collection of signal charges by other (m−1) collection devices is tc (m−1) as previously explained. Since (m−1) is greater than m/2, and m is equal to or greater than three, the time available for the charge collection in the case of the simultaneous transfer of the signal charges from a group of the collection devices is more limited than that in the case of the charge transfer from each collection device.

[A path of an electron from a photoelectric conversion device to a charge collection device is depleted during charge collection by the charge collection device]

Sequential selective collection of the signal charges by a plurality of charge collection devices can be realized also by switching of transistors. A channel of a conventional transistor is not depleted, which causes generation of noise. On the other hand, along a completely depleted charge collection path, the signal charges drift to the surface driven by a monotonically increasing field, which enables theoretically a perfect transfer of the signal charges at a very high speed. If the signal charges are holes, they drift to the surface driven by a monotonically decreasing field.

[The signal charges are selectively collected by punching through a potential barrier between the photoelectric conversion device and the charge collection devices]

By introducing a plurality of the charge collection devices in each pixel of the backside illumination structure disclosed in nonpatent literature 2, the signal charges generated by light incident on a whole pixel area can be selectively collected by one of the charge collection devices by applying a higher voltage to an electrode of one individual collection device to break a potential barrier over the collection device.

In the case, since the path of the signal charges are completely depleted except the backside thin layer, the signal charges are almost completely transferred at a high speed.

Furthermore, the following three advantageous effects are provided by locating the charge collection devices locally in a central part of pixel, and grading the concentration of the potential barrier layer with a higher concentration along a pixel boundary and a lower concentration around the center:

(1) a strong horizontal potential gradient toward the pixel center from the pixel boundary is created along a junction of the photoelectric conversion layer and the potential barrier layer, which drives signal charges generated in the pixel boundary area to the central area at a high speed, (2) the weakened potential barrier near the center is easily punched through with a lower voltage, and (3) the higher potential barrier toward a periphery of the pixel significantly decreases the probability of migration of the signal charges to analogue memories under the potential barrier.

For a circular or polygonal pixel, the central part means an area around the centroid, and for a rectangular pixel, a strip along the horizontal or the vertical center line, in which the charge collection devices are located.

[A barrier between the photoelectric conversion layer and the circuit layer is made with a silicon oxide layer]

A technology employing a layer of silicon oxide as the insulation layer is called SOI (silicon on insulator) technology. A hole is made in the silicon oxide layer at the position in which the charge collection devices are locally placed. The signal charges are sequentially collected through the hole by one charge collection device on the front side to which a higher voltage is applied. In the case, the path of the signal charges can be also depleted.

[The charge collection devices are placed on a circle locating in a central area of the pixel and the sub-pixel groups are formed in a radially expanding shape]

A regular polygon is paved by m sub-pixel units with no space. If the vertex angle of the sub-pixel is 60 degrees, a hexagonal pixel includes six sub-pixel units, each with a charge collection device, a charge transfer device, and other circuits, such as additional memories. The hexagonal pixels completely pave a surface.

In this case, six charge collection devices are placed on a circle centered at the centroid of the pixel at an equal distance. Since the distance from the peripheral area to the center of the pixel is constant, the average time required for a charge collection device to collect signal charges and the standard deviation are the same as those for other charge collection devices to collect signal charges.

Furthermore, a funnel-like potential barrier in the pixel effectively collects the signal charges.

If the vertex angle is 45 degrees, an octagon is paved by eight sub-pixel units without space. However, a plane space is densely paved with a combination of a regular octagon, and a square with the common side with the octagon. Usually, an additional circuit is commonly used by the eight sub-pixel units. The common circuits can be placed in the square area.

A current source circuit is an example of the common circuits. If the sub-pixel unit solely comprises CCD circuits, another possible common circuit in the square is a CMOS readout circuit (refer to FIG. 27).

Especially, an array of the pixels, each with an octagon and a square in a staggered alignment has an advantage in that the pixel pitch is equivalent to 71% (one/(square-root two)) of the pixel pitch of a square array of the octagon-square pixels, which increases the effective pixel count (the number of pixels). (Refer to FIG. 25 and FIG. 29, which will be explained later)

[Focusing incident light on a central area of each pixel with a wave guide]

This invention with a plurality of the charge collection devices in a pixel can be applied to a front-side illuminated image sensor by using a wave guide. The incident light is focused on the inside of each pixel by a microlens, and guided to the central part by a wave guide (a light guide for visible light) with a very low aspect ratio (a tall light guide) at a very high light collection rate (about 80% fill factor).

The charge collection devices placed in the central part sequentially collect the signal charges by applying a higher voltage to one of the charge collection devices.

The technologies disclosed above achieve both high sensitivity required in ultra-high-speed imaging and the theoretically highest frame rate (1/tc) or practically achievable highest frame rate (1/tt). Specific embodiments of the invention are explained in the detailed description of the invention below.

BRIEF DESCRIPTION OF THE DRAWINGS

For the purpose of illustrating the invention, several forms of the invention which are presently preferred are shown, it being understood, however, that the invention is not limited to the precise arrangements and instrumentalities shown.

FIG. 13 is a schematic cross-section view of one pixel in a horizontal direction of the first embodiment for explaining a state in which a thirteenth signal charge packet is collected;

FIG. 14 is a schematic cross-section view of one pixel in a horizontal direction of the first embodiment for explaining a state in which a fourteenth signal charge packet is collected;

FIG. 15 is a schematic cross-section view of one pixel in a horizontal direction of the first embodiment for explaining a state in which charge packets are simultaneously discharged to a drain;

FIG. 16 is an explanatory view illustrating a semiconductor structure and a potential profile in a depth direction in the first embodiment for explaining an operation mode for charge collection;

FIG. 17 is an explanatory view illustrating a semiconductor structure and a potential profile in a depth direction in the first embodiment for explaining an operation mode for charge draining;

FIG. 18 shows a schematic diagram explaining a sequence of operations for the first embodiment;

FIG. 30 shows a geometric formation of electrodes of the sixth embodiment;

FIG. 31 is a view illustrating masks for generating a p-well barrier and separations of sub-pixel units in the sixth embodiment;

DESCRIPTION OF THE EMBODIMENTS

Embodiments of the invention are described, referring to the figures.
(First Embodiment)

Figure 1:
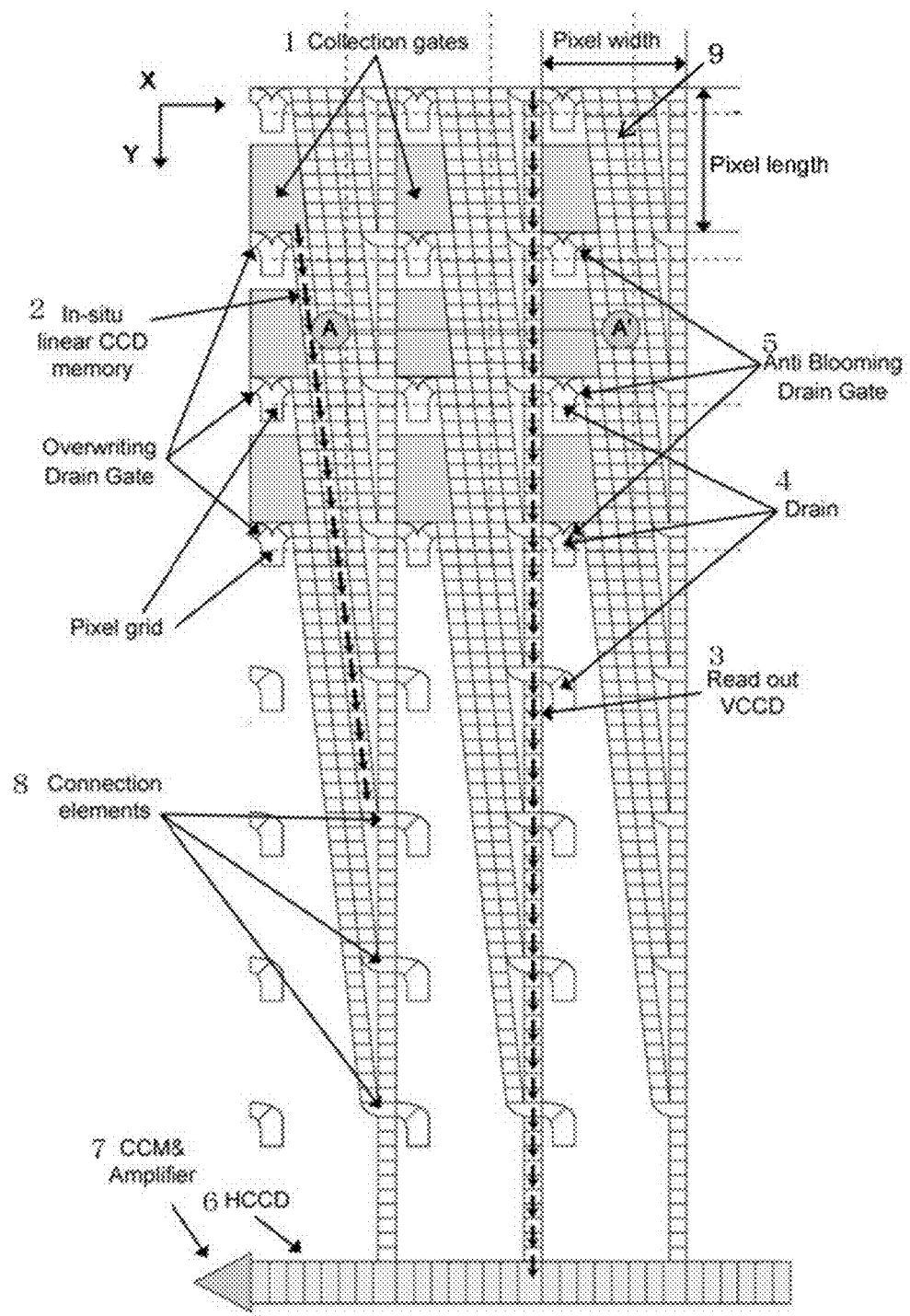
FIG. 1 is a schematic plane view of a high-speed image sensor of a conventional image sensor disclosed in T. Etoh et al., An in-situ storage image sensor of 1,000,000 fps with slanted linear CCD storage, J. of the Institute of Image Information and Television Engineers, 65(3), 483-486, 2002, in Japanese.
Figure 2:
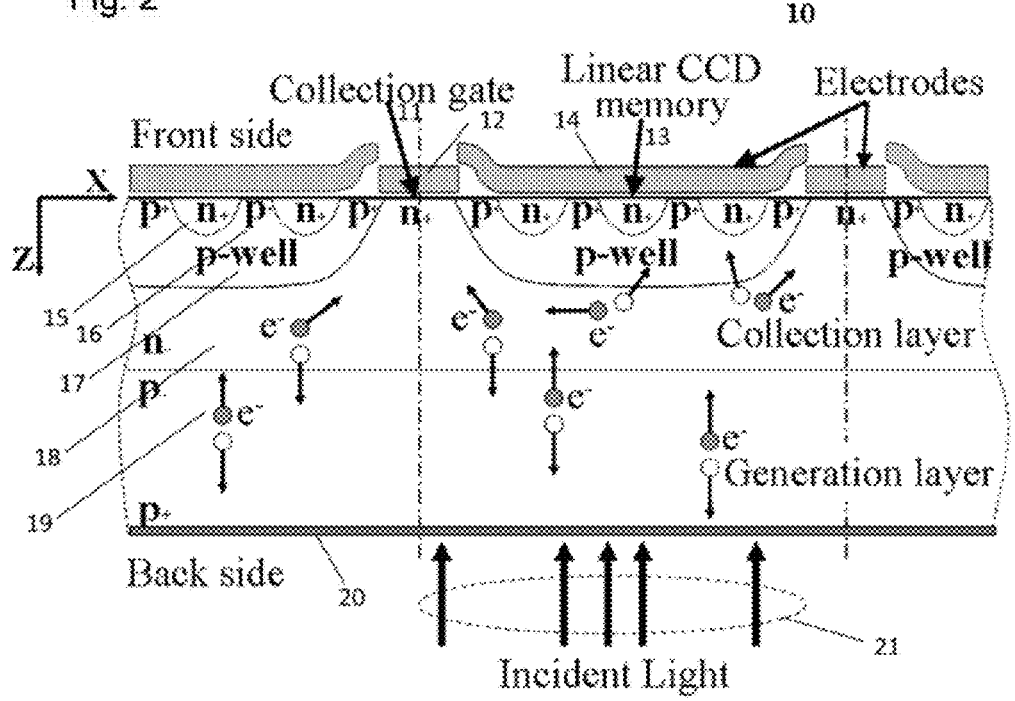
FIG. 2 is a schematic cross-section view of a high-speed image sensor disclosed in T. Etoh, et al., Backside Illuminated Image Sensor of 16,000,000 fps, 65(3), 349-353, 2011, in Japanese, which receives incident light at the backside.
Figure 3:
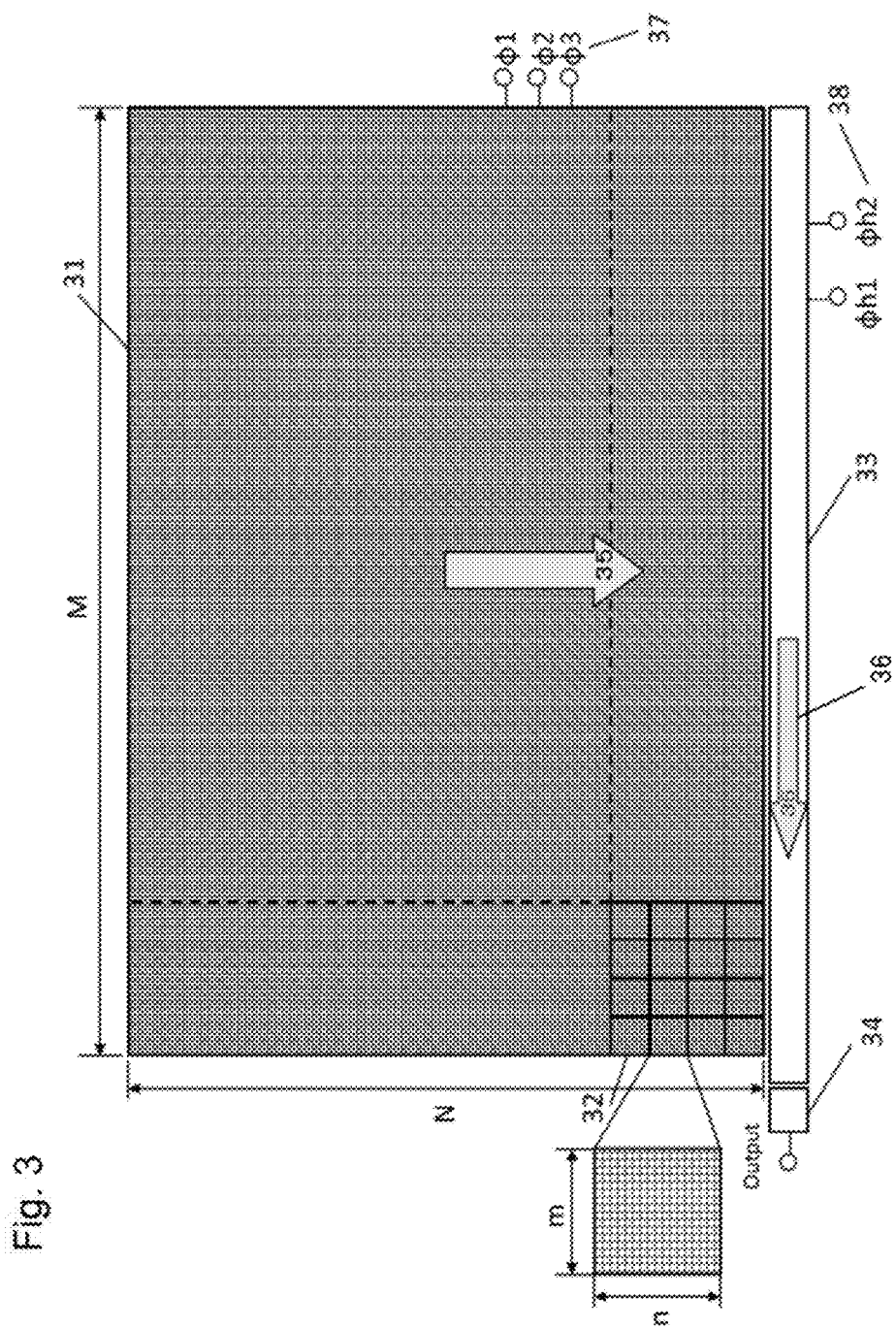
FIG. 3 is a schematic plane view of a first embodiment of an imaging apparatus of this invention.

FIG. 3 shows a plane structure of a first embodiment of the invention, comprising an imaging area 31 including an array of M times N pixels. Each pixel 32 includes an array of m times n CCD transfer stages framed with black lines. Each CCD transfer stage collects signal charges.

A horizontal CCD 33 receives signal charge packets transferred in a direction illustrated with an arrow 35 from the imaging area and transfers the signal charge packets in a direction illustrated with an arrow 36. An output circuit 34 receives the signal charge packets, converts them to voltage signals and outputs them. Clock pulses for three-phase CCD transfer are inputted from terminals 37 to vertically transfer the charge signal packets. Clock pulses to horizontally transfer the signal charge packets are inputted through terminals 38.

The first embodiment of the invention is a backside illuminated image sensor receiving photons incident on the backside, converting most of them to signal charges by photoelectric conversion and collecting the signal charges by the charge collection devices on the front side.

Figure 4:
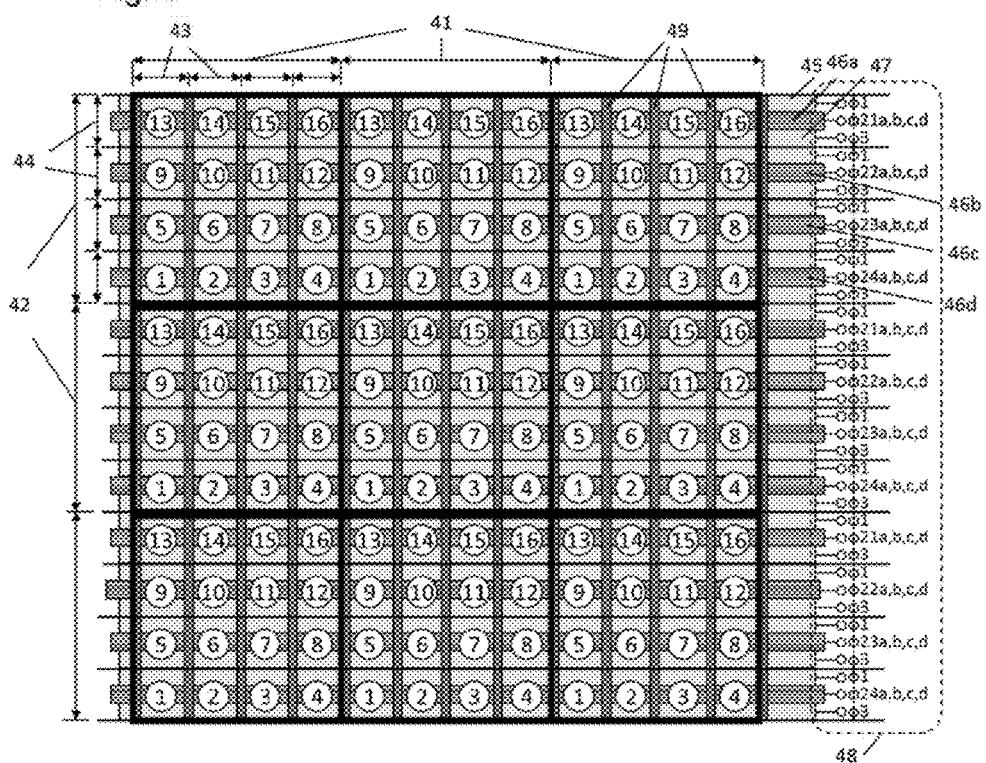
FIG. 4 is a schematic view showing plane architecture of an array of pixels of the first embodiment of this invention.

FIG. 4 shows a partial plane structure to explain the plain structure of the first embodiment in detail. The pixels 32 shown in FIG. 3 are defined with a horizontal pitch 41 and a vertical pitch 42. One CCD transfer stage, which also represents one charge collection device, is defined by a horizontal pitch 43 and a vertical pitch 44. Therefore, one pixel 32 includes 16 (=4 times 4) CCD transfer elements (16 charge collection devices). For detailed explanation, numbers from (1) to (16), each enclosed by a circle, are attached to the CCD transfer stage charge collection devices) in one pixel. (While a circle encloses each number in the figure, round brackets replace the circles in the text.)

Transfer electrodes 45, 46 and 47 horizontally extend. First-phase and third-phase transfer voltage pulses $\phi 1$ and $\phi 3$ are respectively applied to the transfer electrodes 45 and 47. Electrodes (13), (14), (15) and (16) in the charge collection devices 46a are separated and independently operated by different voltage pulses, $\phi 21a$, $\phi 21b$, $\phi 21c$ and $\phi 21d$ during an image capturing phase and by second-phase transfer voltage pulses $\phi 2$ during a readout phase.

Electrodes (9), (10), (11) and (12) in the charge collection devices 46b are separated and independently operated by voltage pulses, $\phi 22a$, $\phi 22b$, $\phi 22c$ and $\phi 22d$ during an image capturing phase. Electrodes (5), (6), (7) and (8) in the charge collection devices 46c are separated and independently operated by voltage pulses, $\phi 23a$, $\phi 23b$, $\phi 23c$ and $\phi 23d$ during an image capturing phase. Electrodes (1), (2), (3) and (4) in the charge collection devices 46d are separated and independently operated by voltage pulses, $\phi 24a$, $\phi 24b$, $\phi 24c$ and $\phi 24d$ during an image capturing phase.

The eighteen voltage pulses $\phi 1$, $\phi 21a$, $\phi 21b$, $\phi 21c$, $\phi 21d$, $\phi 22a$, $\phi 22b$, $\phi 22c$, $\phi 22d$, $\phi 23a$, $\phi 23b$, $\phi 23c$, $\phi 23d$, $\phi 24a$, $\phi 24b$, $\phi 24c$, $\phi 24d$ and $\phi 3$ are delivered through terminals 48. Separation layers 49 separate the vertical transfer CCDs. If necessary, a drain to discharge excessive charges (including drains for resetting) can be installed in the separation layer.

Figure 5:
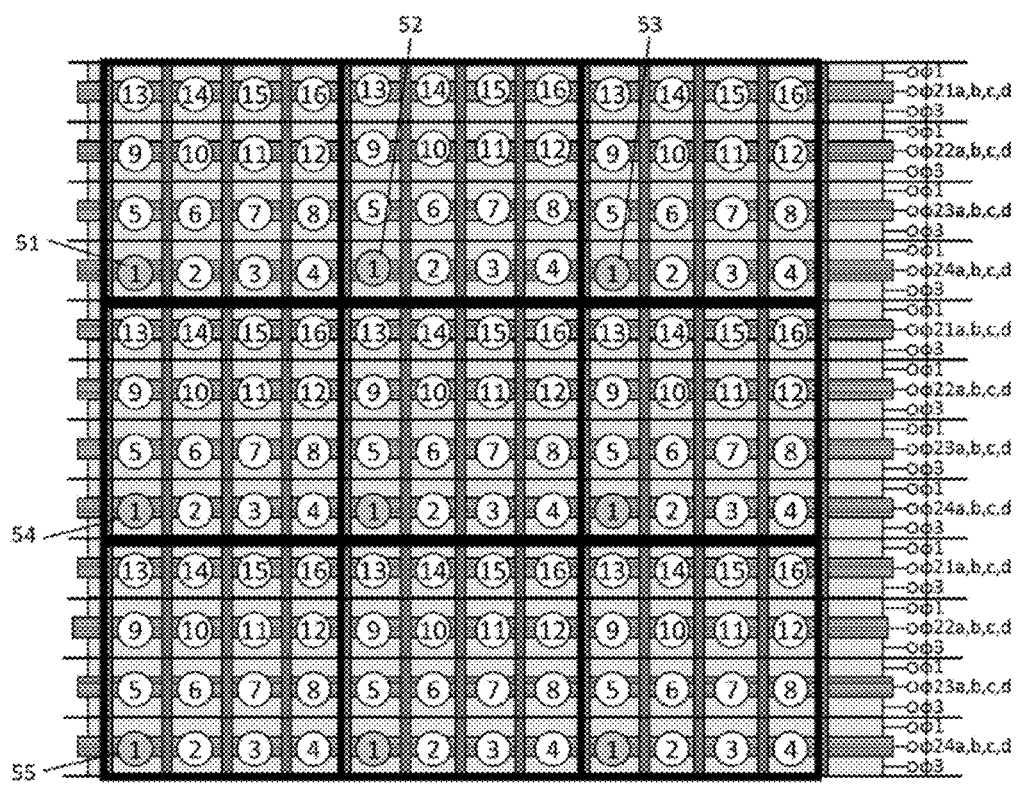
FIG. 5 is an explanatory view of the array of pixel illustrating collection of a first charge packet in the first embodiment.

FIG. 5 to FIG. 8 illustrate an operation mode of the first embodiment of the invention. FIG. 5 shows a state in which a high-voltage charge-collection pulse $\phi 24a$ to collect signal charges is applied to the charge collection devices 51 to 55, respectively of the first, the second, the third, the fourth and the seventh pixels (the charge collection devices (1) in each pixel 32).

Before application of the high-voltage charge-collection pulse $\phi 24a$, signal charges generated by light incident on the backside are almost uniformly distributed and stored in the bulk of each pixel 32, which is explained in detail later. Upon application of the high voltage to the charge collection devices (1), the signal charges uniformly distributed in the bulk of each pixel are simultaneously collected by each charge collection device (1), and stored in the charge collection device (CCD transfer stage) on the front side. The time required for the signal charges to be temporally stored in the bulk and collected by the charge collection device is represented by tc, which is equal to or shorter than ti.

Figure 6:
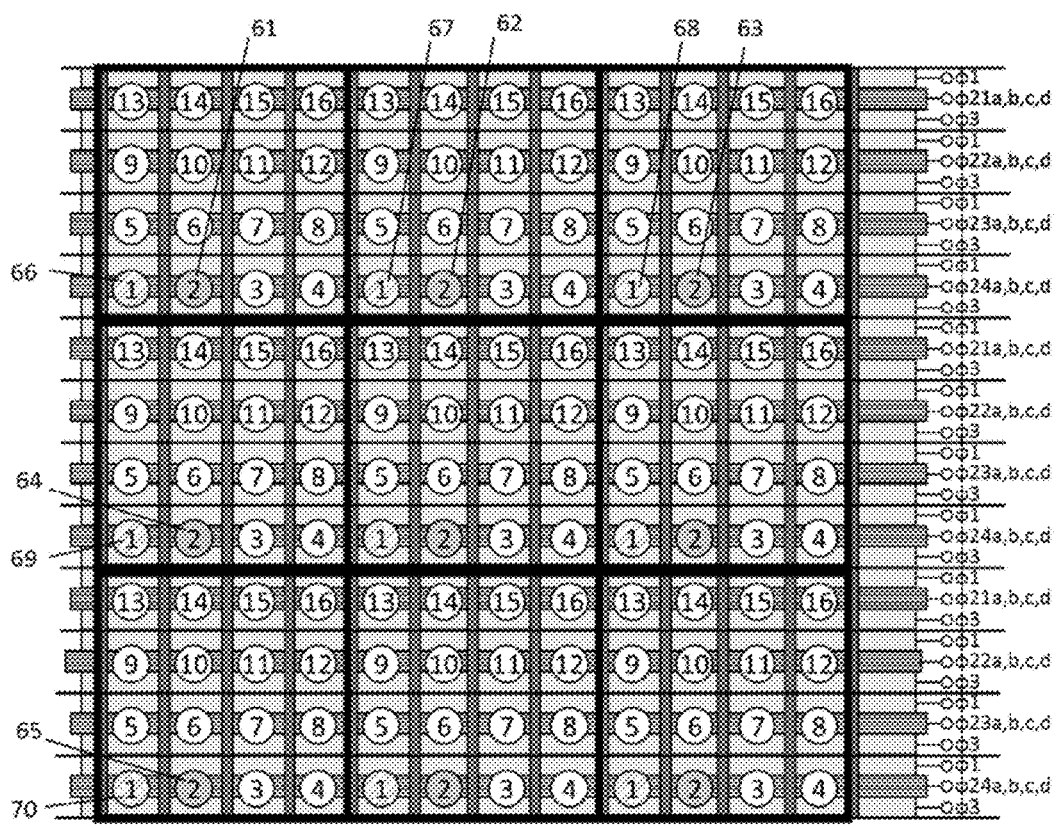
FIG. 6 is an explanatory view of the array illustrating collection of a second charge packet in the first embodiment.

FIG. 6 shows a state in which the CCD transfer stages (1) of all pixels 32 store the signal charge packets. Then, the high-voltage pulse $\phi 24b$ is applied to the charge collection devices 61 to 65, respectively, of the first, the second, the third, the fourth, and the seventh pixels (the charge collection devices (2) in each pixel 32). After a waiting time ti after completion of application of the charge collection pulse $\phi 24a$, the charge collection pulse $\phi 24b$ is applied.

Figure 7:
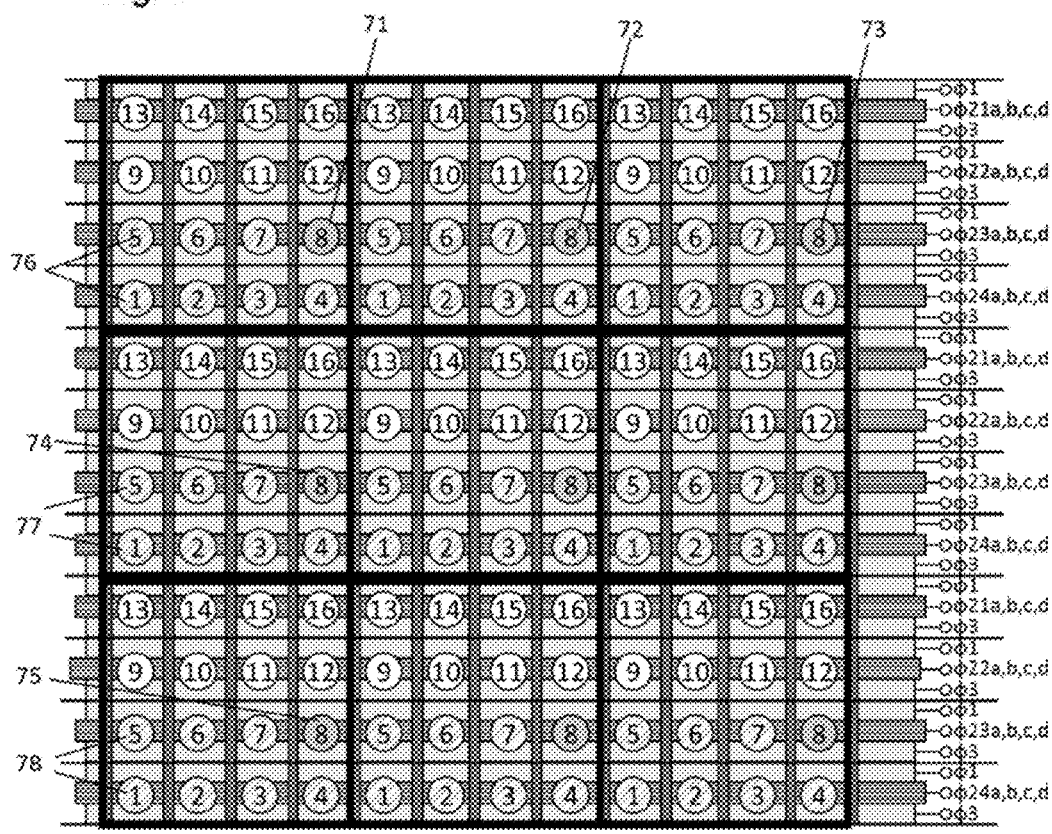
FIG. 7 is an explanatory view of the array of pixel illustrating collection of an eighth charge packet in the first embodiment.

FIG. 7 shows a state in which, after repeating the above-mentioned operation for collection of signal charges by (3) to (7), the charge collection pulse $\phi 24d$ is applied to the charge collection devices 71 to 75, respectively, of the first, the second, the third, the fourth, and the seventh pixels, (the charge collection devices (8) in each pixel 32). At this instant, the signal charges have been collected and are stored in the charge collection devices 76, 77 and 78 (the charge collection devices (1) to (7) in each pixel 32).

Figure 8:
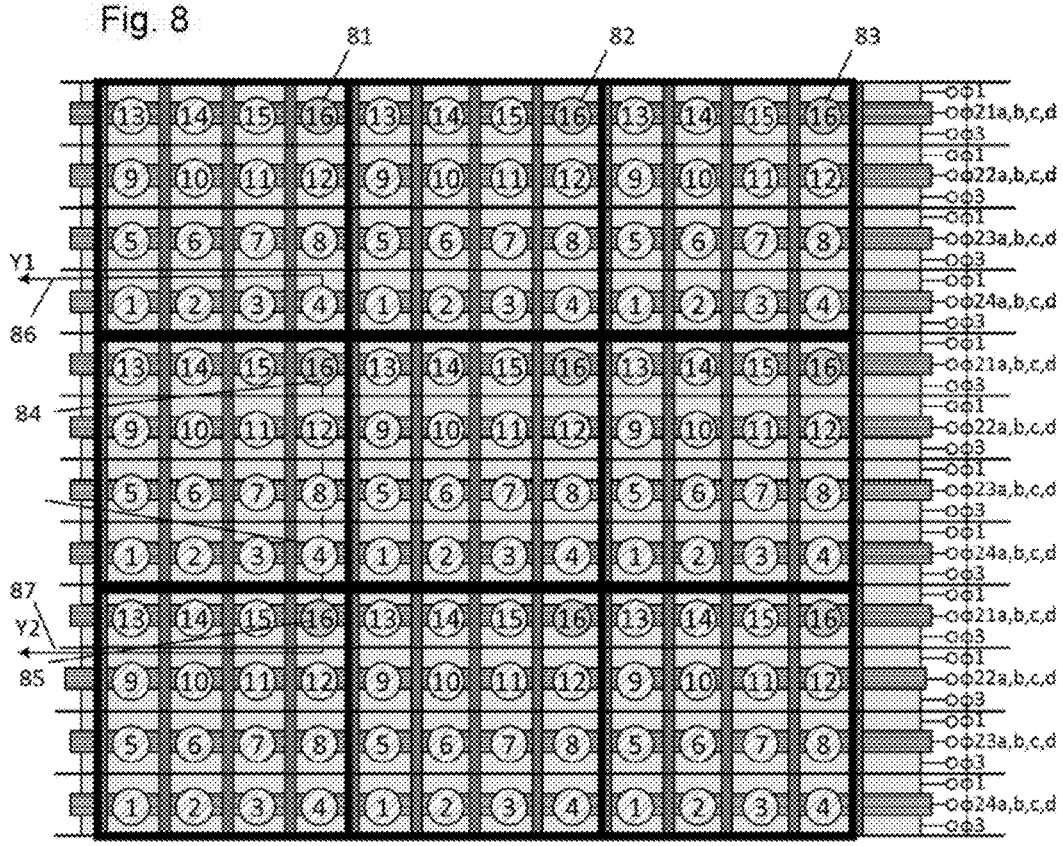
FIG. 8 is an explanatory view of the array of pixel illustrating collection of a sixteenth charge packet in the first embodiment.

FIG. 8 shows a state in which, after further repeating the above-mentioned operations for collection of signal charges by (9) to (15), the charge collection pulse $\phi 24d$ is applied to the charge collection devices 81 to 85, respectively, of the first, the second, the third, the fourth, and the seventh pixels (the charge collection devices (16) in each pixel 32). At this instant, the signal charges have been collected and are stored in the charge collection devices (1) to (15) in each pixel 32.

All the charge collection devices (1) to (16) of every pixel 32 are filled with signal charges at the instance of completion of the signal charge collection by the charge collection devices (16). The state is a charge storing (integrated) state, in which the signal charges for consecutive 16 frames are stored in the order of (1), (2), (3), (4), (5), (6), (7), (8), (9), (10), (11), (12), (13), (14), (15) and (16) with time interval of ti.

Figure 9:
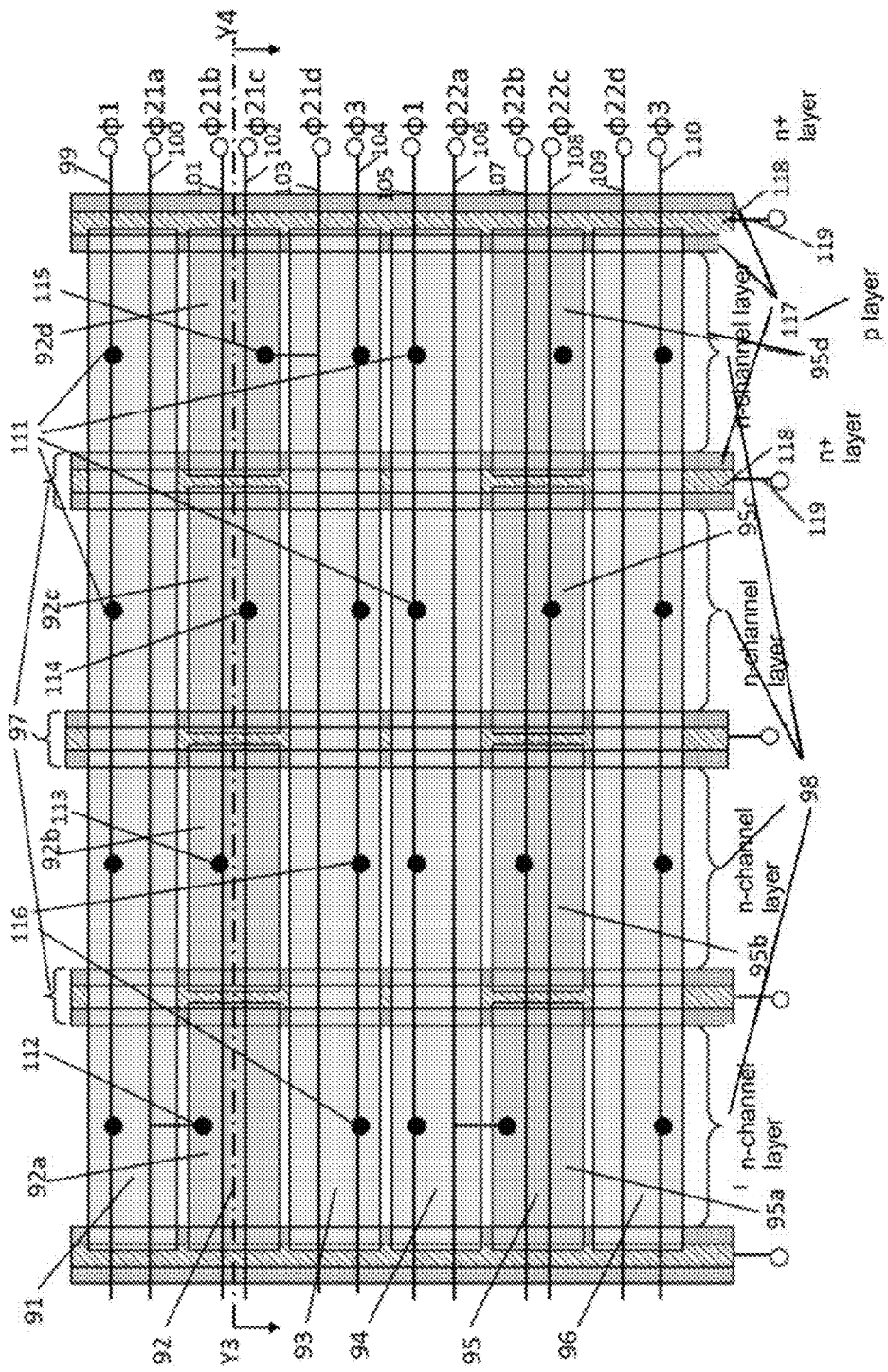
FIG. 9 is a partial plane view showing a geometric formation of electrodes and wires to deliver driving voltages in the first embodiment.
Figure 10:
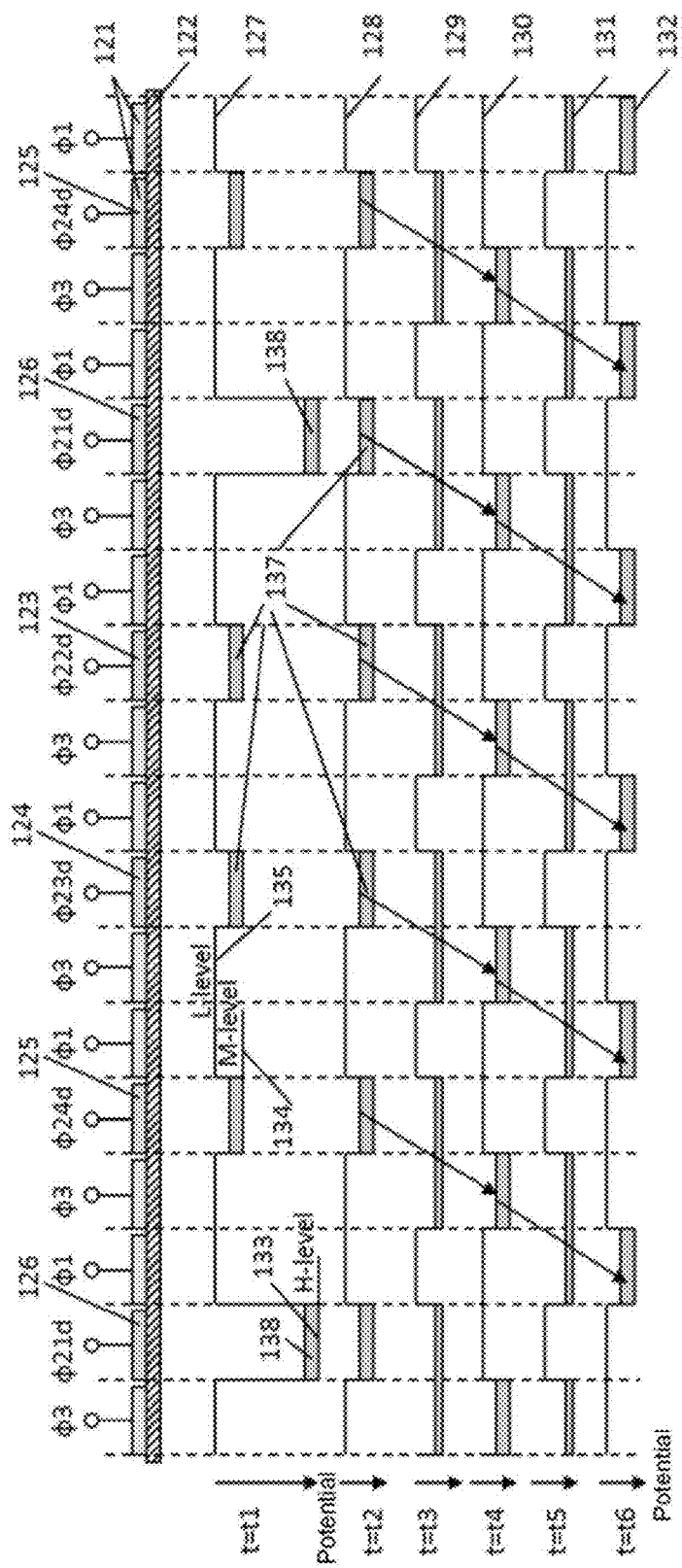
FIG. 10 is a schematic view of the electrodes and potential profiles for explaining an operation mode for the charge collection and a three-phase CCD charge transfer in the first embodiment.

The stored signal charges are transferred by the three-phase CCD transfer in a vertical direction illustrated with an arrow 35 to the horizontal CCD 33 line-by-line (row-by-row), and, then, in a horizontal direction to the output circuit 34, converted to voltage signals in the output circuit, and read out of the sensor. FIG. 9 illustrates a detailed layout of electrodes and wires to deliver voltage pulses to the electrodes to control the charge collection devices. FIG. 10 illustrates channel potential profiles and a transfer process of the signal charges from the charge collection to the vertical transfer on a segment Y1-Y2 (86, 87) of the charge collection devices (CCD transfer stages) shown with a dashed-dotted line in FIG. 8. The figure shows an insulation layer 122, which is a silicon oxide film, formed on the surface of a bulk silicon semiconductor, and a group of charge transfer electrodes 121, including charge collection electrodes 123, 124, 124 and 126 (the electrodes of said charge collection devices ((12), (8), (4) and (16), respectively), which also work as transfer gate electrodes.

Figure 11:
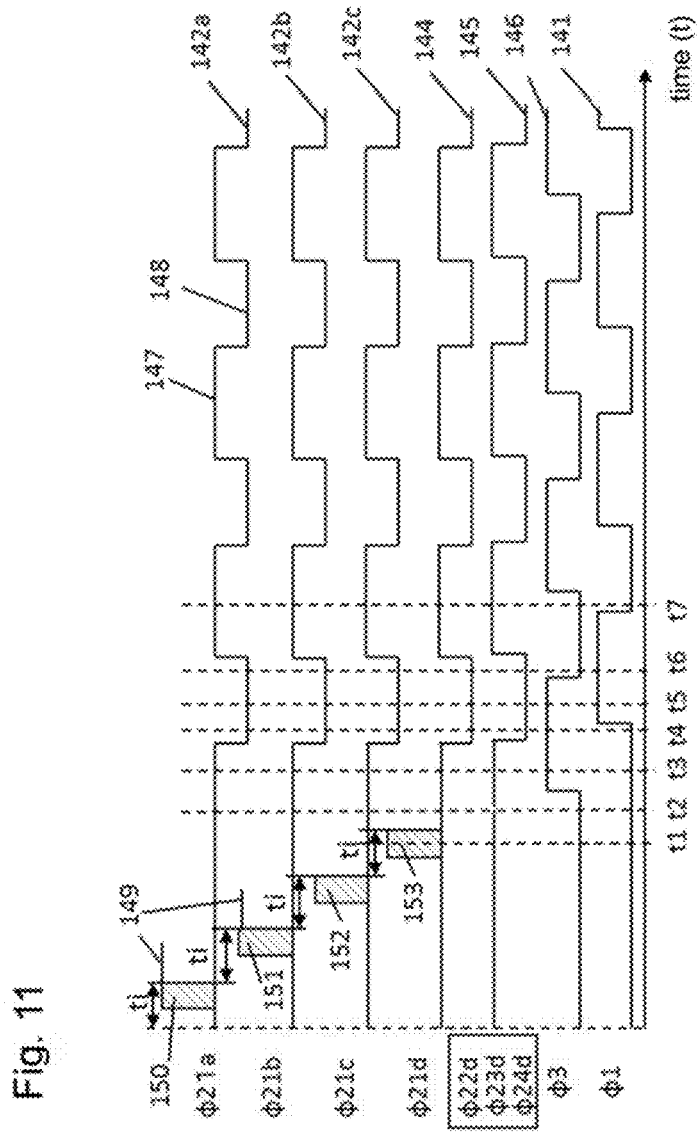
FIG. 11 shows a timing diagram for explaining an operation mode for the charge collection and a three-phase CCD charge transfer in the first embodiment.

As shown in FIG. 10, six voltage pulses φ1, φ21d, φ22d, φ23d, φ24d, φ3 are applied to control the charge collection and the transfer. FIG. 11 shows a timing diagram of the six pulses. Pulse sequences 141, 146 and 144 are respectively applied to φ1, φ3 and φ21d. A pulse sequence 145 is commonly used in φ22d, φ23d and φ24d. Pulse sequences 142a, 142b and 142c are applied to φ21a, φ21b and φ21c respectively to control electrodes (13), (14) and (15) for both charge collection and transfer.

In FIG. 11, a voltage 147 is a medium voltage VM, which is usually fixed at a ground level, GND. A voltage 148 is a low voltage VL, usually negative. A voltage 149 in a pulse sequence is a high voltage VH, which is a sufficiently high positive voltage to collect signal charges. The pulses 150, 151, 152 and 153 are respectively charge-collection pulses for the charge collection devices (13), (14), (15) and (16) to collect signal charges.

As illustrated in the figure, the charge-collection pulses 150 to 153 are applied to the electrodes of the charge collection devices with the time interval ti, which defines the frame rate of the imaging. The CCD illustrated in FIG. 10 is controlled by the pulse-timing diagram illustrated in FIG. 11. The channel potential profile and the transfer of the signal charge packets in this case are explained below.

The channel potential profile 127 in FIG. 10 is the potential profile at time t1 in FIG. 11. A medium potential level M 134, a low potential level L 135 and a high potential level H 133 are respectively created by applying the medium voltage VM, the low voltage VL and the high voltage VH to the electrodes immediately above the CCD channel. Signal charge packets 137 are those stored at the medium potential level M after the charge collection. Signal charge packets 138 are being collected at the charge collection devices (16) by the high potential level H.

The channel potential profile 128 is the potential profile at time t2 in FIG. 11. The signal charge packets stored by the potential profile are also illustrated. The charge collection has been completed by applying a high voltage VH to the electrode 21d, and all signal charge packets are kept by the medium channel potential M. Then, a three-phase vertical transfer begins in the direction of the arrow 35 in FIG. 3 (right to left in FIG. 10). The three-phase transfer is briefly explained later.

The channel potential 129 is the potential profile at time t3 in FIG. 11. The pulse voltage φ3 changes from the low voltage VL to the medium voltage VM, and the corresponding channel potential level changes from the low potential L to the medium potential M. Then, the signal charge packets proceed to the channel under the electrodes to which φ3 is applied, and are stored there. The channel potential 130 is the potential profile at time t4 in FIG. 11. The pulses φ21d, φ22d, φ23d and φ24d change from the medium voltage VM to the low voltage VL, and the corresponding channel potential levels change from the medium level M to the low level L, which moves the signal charge packets to the channel under the φ3 electrodes and store the signal charge packets there. Therefore, the signal charge packets are transferred by a distance of one electrode from time t2 to time t4.

The channel potential 131 is the potential profile at time t5 in FIG. 11. The pulse voltage φ1 changes from the low voltage VL to the medium voltage VM, and the corresponding channel potential level changes to the medium potential M. The signal charge packets proceed to the channel under the electrodes to which φ1 is applied and are stored there.

The channel potential 132 is the potential profile at time t6 in FIG. 11. The pulse φ3 changes from the medium voltage VM to the low voltage VL, and the corresponding channel potential level change to the low level L, which moves the signal charge packets to the channel under the φ1 electrodes and store the signal charge packets there. Therefore, signal charge packets are transferred by a distance of two electrodes from time t2 to time t6.

By repeating the similar operation once more, by time t7, all signal charge packets are transferred by a distance of three electrodes, namely, one CCD transfer stage.

By transferring the signal charge packets on the vertical CCD by one CCD transfer stage in parallel in the vertical direction, using the operation mode explained above, the signal charge packets in the last row are transferred to the horizontal CCD 33 in FIG. 3, and finally read out of the output circuit 34 as the image signals as explained before. In the operation, a first output sequence from the horizontal CCD includes output signals of 4 times M, which are image signals for four consecutive frames, arranged in the order of (1), (2), (3), (4), (1), (2), (3), (4), ..., (1), (2), (3), (4). After completion of readout of the first sequence, the vertical CCD transfers the signal charge packets by one CCD transfer stage in parallel, using the three-phase transfer explained above. Then, a second output sequence from the horizontal CCD is read out, which includes 4M image signals for the next four frames, arranged in the order of (5), (6), (7), (8), (5), (6), (7), (8), ..., (5), (6), (7), (8). By further repeating the same operation twice, image signals for 16 frames are read out, which were in four rows of the horizontal CCD stages (collection devices). The operation sequence explained above is repeated N times, and, then, image signals for 16 frames are read out, where one frame includes the pixels of M columns times N rows.

FIG. 9 shows a more detailed partial plane structure of the first embodiment of this invention. A transfer pulse φ1 is applied to transfer electrodes 91 and 94, which are commonly placed over all vertical transfer channels. A transfer pulse φ3 is applied to transfer electrodes 93 and 96, which are commonly placed over all the vertical transfer channels.

On the other hand, electrodes 92, including electrodes 92a, 92b, 92c and 92d on different vertical channels, are separate electrodes independently controlled by application of transfer pulses φ21a, φ21b, φ21c, and φ21d, respectively. Electrodes 95, including electrodes 95a, 95b, 95c and 95d on the different vertical channels, are separate electrodes independently controlled by application of transfer pulses φ22a, φ22b, φ22c, and φ22d, respectively. The vertical channels 98 are separated with channel separations 97.

The transfer pulse φ1 is supplied to the electrodes 91 and 94 through contact points 111 from voltage transfer lines 99 and 105, respectively. The transfer pulses φ21a, φ21b, φ21c, and φ21d are supplied to the electrodes 92a, 92b, 92c, and 92d through contact points 112, 113, 114, and 115 from voltage transfer lines 100, 101, 102 and 103, respectively. The transfer pulse φ3 is supplied to the electrodes 93 and 96 through contact points 116 from voltage transfer lines 99 and 105, respectively. The transfer pulses φ22a, φ22b, φ22c, and φ22d are supplied to the electrodes 95a, 95b, 95c, and 95d through contact points from voltage transfer lines 100, 101, 102 and 103, respectively.

The voltage transfer lines explained above supply all the transfer pulses to control all the electrodes in the first embodiment of this invention.

The separation layers 97 separate the vertical transfer CCDs. The separation layer can drain excessive charges or unnecessary charges.

In FIG. 9, the separation layers 97 includes a drain layer of a high-concentration n-layer 118 to which a constant positive voltage is usually applied from a terminal 119 and separation p-layers 117 to which a zero voltage (GND level) is normally applied to electrically separate the drain layer 118 from the n-layer channels. By applying a high voltage to the drain layer 118, instead of the constant usual voltage, the drain layer absorbs all charges from the bulk silicon layer at once. The drain under the usual positive voltage receives excessive charges spilling out of the n-layer transfer channels.

An operation mode of signal charge collection in the first embodiment of this invention is explained, referring to FIG. 12, FIG. 13, FIG. 14 and FIG. 16.

Figure 12:
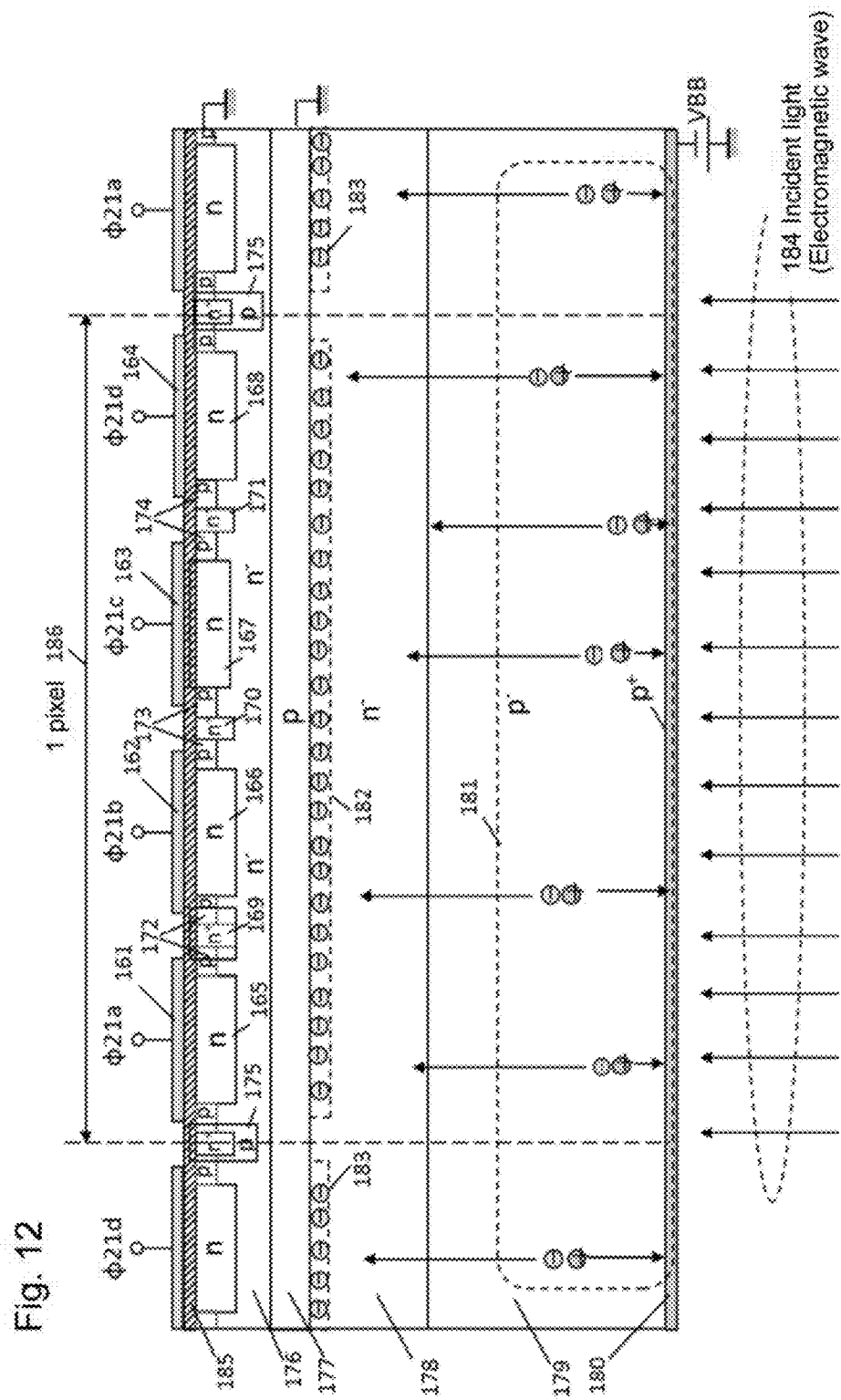
FIG. 12 is a schematic cross-section view of one pixel in a horizontal direction of the first embodiment.

FIG. 12 shows a cross-sectional structure of FIG. 9 along a cut line Y3 to Y4. The transfer pulses φ21a, φ21b, φ21c, and φ21d are respectively applied to the charge collection gates 161, 162, 163 and 164, which also function as the transfer gates. An insulation layer 185 on the surface of a Si semiconductor is normally made of silicon oxide ($S_iO_2$). The n-type transfer channel layers 165, 166, 167 and 168 are formed close to the surface of the semiconductor under the electrode layer. The drains of the high-concentration n-layers 169, 170 and 171 sandwiched by the p-type separation layers 172, 173 and 174 are formed in the n-channel layers 165, 166, 167 and 168.

Pixel-definition layers 175 each defines the area of a pixel by separating a charge storage layer of each pixel from the others. In low-concentration n-layers 176 and 178, a p-type barrier layer 177 is formed to interrupt charges to move into the CCD. A low-concentration p-layer 179 forms a pn junction with the n-layer 178. A high-concentration verythin p-layer 180 is formed at the backside of the $S_i$ semiconductor.

The ground voltage is applied to the p-type separation layers 172, 173 and 174, the pixel-definition layers 175, and the barrier layer 177, and a negative reversely-biased voltage (−VBB) is applied to the high-concentration p-layer at the backside. The reversely-biased voltage (−VBB) almost depletes the pn junction between the low-concentration layers 178 and 179a, and creates a field toward the lower side from the upper side of the figure with space charges made with acceptor and donor ions. At the start of image capturing, electrons in the low-concentration n-layer 178 should be drained to the $n^+$ drain layers 169, 170 and 171. Also during the image capturing, the electrons in the layer 178 can be drained to the drain layer, when the draining is necessary.

The first embodiment is about a backside-illuminated image sensor. An incident light (electromagnetic wave) 184 for imaging intrudes into the semiconductor from the backside. In the conversion layer 181, an electron-hole pair is generated by energy conversion of the incident light. A short-wave light with higher photon-energy is converted to the electron-hole pair near the backside; a long-wave light with lower photon-energy including an infra-red light penetrates to a deeper layer, and is converted to the electron-hole pair.

The generated electron-hole pair is separated by the electric field. The hole is moved to the $p^+$ layer 180 at the backside and absorbed in the layer, and the electron is moved toward the surface. However, the electron moving toward the surface is interrupted by the barrier layer 177, and integrated in the pn junction layer created by the barrier layer 177 and the low-concentration n-layer 178.

An area 182 is "a bulk storage layer" for one pixel in which electrons are integrated as a signal charge packet. An area 183 is a neighboring bulk storage layer which is electrically separated from the bulk storage layer 182 by the pixel-definition layers 175 with deep pn junctions to avoid mixture of the signal charges of the bulk storage layer 182 and 183. The pixel-definition layers define the pixel 186.

The semiconductor $S_i$ of the first embodiment of this invention is 50 μm thick, which is sufficient to absorb the incident light and prevent generated electrons from migrating to the charge collection n-layers 165 to 168, and generating noise in the n-layers. If the incident light is only visible light, the thickness of 30 μm is sufficient. However, if the incident light includes near-infra-red light, the thickness of 50 μm or more is required.

A color filter, a microlens and an anti-reflection layer on the backside are well-known technologies, and so not drawn in the figures. The color filter placed on the backside reduces the thickness of the semiconductor layer. The microlens and the anti-reflection layer increase light collection efficiency of collection of light.

Hereafter, an operation mode of signal charge collection in the first embodiment of this invention is explained in detail. Application of a high voltage of φ21a to the electrode 161 increases the potential of the n-type channel layers 165 approximately proportionately to the voltage and elongates the depletion layer in the direction toward the surface. The depletion layer depletes the p-type barrier layer 177, creating a punch-through state from the bulk storage layer to the n-type channel.

The punch-through state is shown as a shaded portion 193. A potential profile of this state is shown in FIG. 16, which is explained later in detail. A high voltage pulse VH is applied to φ21a operating the electrode 191 for the charge collection. In this state, signal charges 194 in the bulk storage layer 182 are driven through the punch-through area 193 and then instantly to the charge collection layer 193. When the high voltage is released and the φ21a voltage returns to the medium voltage 0 V for storage, the charge collection layer 192 is detached from the bulk storage layer 182 by the barriers layer and the charges collected by the collection layer 192 are stored in the charge collection layer. FIG. 14 shows the charge collection layer 205 in the charge storage state.

FIG. 14 also shows the charge collection layer 202 at the high potential created by application of the charge collection high voltage VH to φ21b operating the electrodes 201. The area 203 is at the punch-through state. The signal charges 204 in the bulk storage layer are driven through the punchthrough area 203, and then instantly collected by the charge collection layer 202. When the high voltage is released and the φ21b voltage returns to the medium voltage 0 V, the charge collection layer 202 is detached from the bulk storage layer 182 and the charges collected by the collection layer 202 are stored there.

By sequential application of the charge collection high voltage VH to the electrodes operated by φ21c and φ21d, all charge collection layers lying in the same horizontal strip are filled with and store the signal charges.

By sequential application of the high voltage VH to the electrode (1) operated by φ24a to the electrode (16) operated by φ21d of each pixel with the time interval ti, image signals for 16 consecutive frames are recorded at the frame rate of (1/ti) (as shown in FIG. 5 to FIG. 8). An additional operation mode is further necessary to fix an initial condition to start the image capturing.

There are several operation modes for reset. One of them is that the bulk storage layers 182 and 183 are emptied by draining all charges to the high-concentration n-type drains 169, 170 and 171. The operation mode is explained in FIG. 5.

A voltage ϕDR is applied to each drain from a terminal 211 in FIG. 15. Upon application of the high voltage to the drain, a depletion layer extends from the high-concentration n-drain layer to the bulk storage layer as explained in the charge collection process ([108] to [110]). The extended depleted layer depletes the p-type barrier layer 177 and reaches the low-concentration n-layer, which creates the punch-through state 212 penetrating the bulk storage layer 182.

In this state, charges in the bulk storage layer are driven through the punch-through areas 212 as explained in the charge collection process, and instantly absorbed and drained by the drains 169, 170 and 171, which empties the bulk storage layer and reset it to the initial condition.

FIG. 16 and FIG. 17 describe the operation modes for the collection and the drainage of charges by using the punch-through. FIG. 16a shows a one-dimensional structure along the depth, which contains the charge collection electrodes 213, the insulation layer (an oxide layer) 214, the n-type charge collection storage layer 215, the low-concentration n⁻ layers 216, 218, the p-type barrier layer 217, the low-concentration p⁻ layer 219, and the high-concentration p⁺ layer 220 along the backside of the semiconductor.

FIG. 16b shows a potential profile along the structure shown in FIG. 16a. The potential at the ground potential level 223 is 0 V. A lower area below the ground level 223 is a positive area. An upper area is a negative area. A negative voltage 224 (−VBB) is applied to the p⁺ layer 220 on the backside to fix the backside voltage of the semiconductor. An electrode voltage 225a is at the medium voltage VM (0 V) at the charge storage state. A curve line 210 is the potential profile from the electrode 213 to the backside 220 in this state.

The low-concentration n⁻ layer 218 and the low-concentration p⁻ layer 219 are both depleted, and space charges are exposed. The potential level 229 is the lowest at the barrier layer, which is fixed at the ground level and in a non-depletion condition. The potential level 226 is the highest of the low-concentration n⁻ layer 218, around which the bulk storage layer is created. An electron packet 232 generated by photo-electron conversion is stored in the bulk storage layer.

Then, the high voltage pulse VH is applied to the charge collection electrodes 213. For the condition, the potential profile 222 from the electrode 213 to the backside 220 is shown. The potential profile contains an electrode potential 225b, a highest potential 227 of the charge collection n⁻ layer 215, and the potential 230 of the barrier layer 217. As shown in the figure, the depleted layer extends from the charge collection n layer to the deeper layers penetrating the barrier layer 217, and directly connects the n⁻ layers 218 and 214.

This profile represents the punch-through state explained above. Since the potential 229 changes to the potential 230 and the barrier disappears, the charges 232 in the bulk storage layer instantly move to the collection layer 215. A dotted line 231 represents a path of charges (electrons) and a group of circles 233 represents collected charge packet.

Even when VH is applied to one electrode, as VM is applied to the neighboring electrodes, the potential profile 221 is created from the neighboring electrodes to the backside of the semiconductor. Therefore, the potential barrier 229 of the barrier layer 217 electrically separates the bulk storage layer 226 and the charge collection layer 215 at the neighboring electrodes. Therefore, a charge packet 228 is being stored in the collection layer 225 after the charge collection process.

By the operation mode explained above, the signal charge packet stored in the bulk storage layer is selectively collected by the charge collection layers 215.

FIG. 17 describes an operation mode to reset the semiconductor to the initial condition by draining the charges to the drain. FIG. 17(a) is a one-dimensional structure along the depth, containing the high-concentration n-type drain layer 261 and the other elements 216 to 220 shown in FIG. 16a.

FIG. 17(b) shows a potential profile along the structure shown in FIG. 17(a). The drain steadily receives excessive charges spilling out of the collection layer 215 (refer to FIG. 16) and discharges them to the outside of the semiconductor. The drain layer voltage is biased with the voltage VDRO 262. A curve line 214 shows the potential profile under this condition with the barrier potential 268 of the barrier layer 217 and the potential 267 of the bulk storage layer.

The barrier layer 217 is non-depleted similarly to the state shown with the curve line 221 in FIG. 16, and the voltage 268 is fixed at the ground level. Therefore, the potential 267 of the bulk storage layer in this state is equal to the potential 226 in FIG. 16. A charge packet 271 is stored in the bulk storage layer.

Then, a voltage pulse VDRH for initialization is applied to the drain. Then, the potential profile 264 changes to the potential profile 265 with the drain potential 263 and the barrier potential 269. As explained in the charge collection process shown in FIG. 16, the depletion layer extends from the drain layer 261 to the bulk storage layer 218, depleting the barrier layer 217 to create the punch-through state. Then, the potential barrier of the barrier layer disappears, the charge packet 271 is instantly discharged to the drain in the direction shown in the dotted line 270, and the bulk storage layer is emptied (the initial state).

The operation sequence of the first embodiment of this invention explained above is summarized in FIG. 18 with a ϕDR pulse 241 to control the drain, ϕ24a pulse 242 to control the first charge collection electrode, and to ϕ22d pulse 243, ϕ21a pulse 244, ϕ21b pulse 245, ϕ21c pulse 246 and ϕ21d pulse 247 respectively to control the 12$^{th}$, the 13$^{th}$, 14$^{th}$, the 15$^{th}$ and the 16$^{th}$ collection (and storage) electrodes. The high voltage pulse ϕDRH 255 of the drain control voltage ϕDR resets the imaging device to the initial condition.

A high voltage pulse VH 248 is applied to the first collection electrode during a time interval ti from a time at the end of application of ϕDRH. The high voltage pulses VH 249, 250, 251, 252 and 253 are sequentially applied to the 12$^{th}$, the 13$^{th}$, 14$^{th}$, the 15$^{th}$ and the 16$^{th}$ collection electrodes, respectively, during ti from the end of a charge collection by application of VH to one collection electrode to the next charge collection.

As shown in FIG. 10, after completion of the charge collection by all sixteen charge collection electrodes, a vertical transfer pulse 254 for three-phase transfer is applied to the collection electrodes to read out the image signal charge packets for the M times N pixels captured at (1/ti) frames per second.

In the embodiment the charges generated by light incident on substantially a whole pixel area are guided to one designated collection layer in turn, stored there and transferred by the three-level voltage sets, consisting of the high voltage VH to collect charges, the medium voltage VM to hold the charges and the low voltage VL to transfer the charges. The operation mode enables the charge collection at one collection electrode, keeping the charges in other collection electrode.

As this embodiment comprises a simple CCD structure, an ultra-high-speed image sensor can be fabricated anytime by the special backside illumination structure disclosed in nonpatent literature 2 as shown in FIG. 2 and FIG. 12 to FIG. 16, and conventional CCD technologies.

(Second embodiment)

Figure 19:
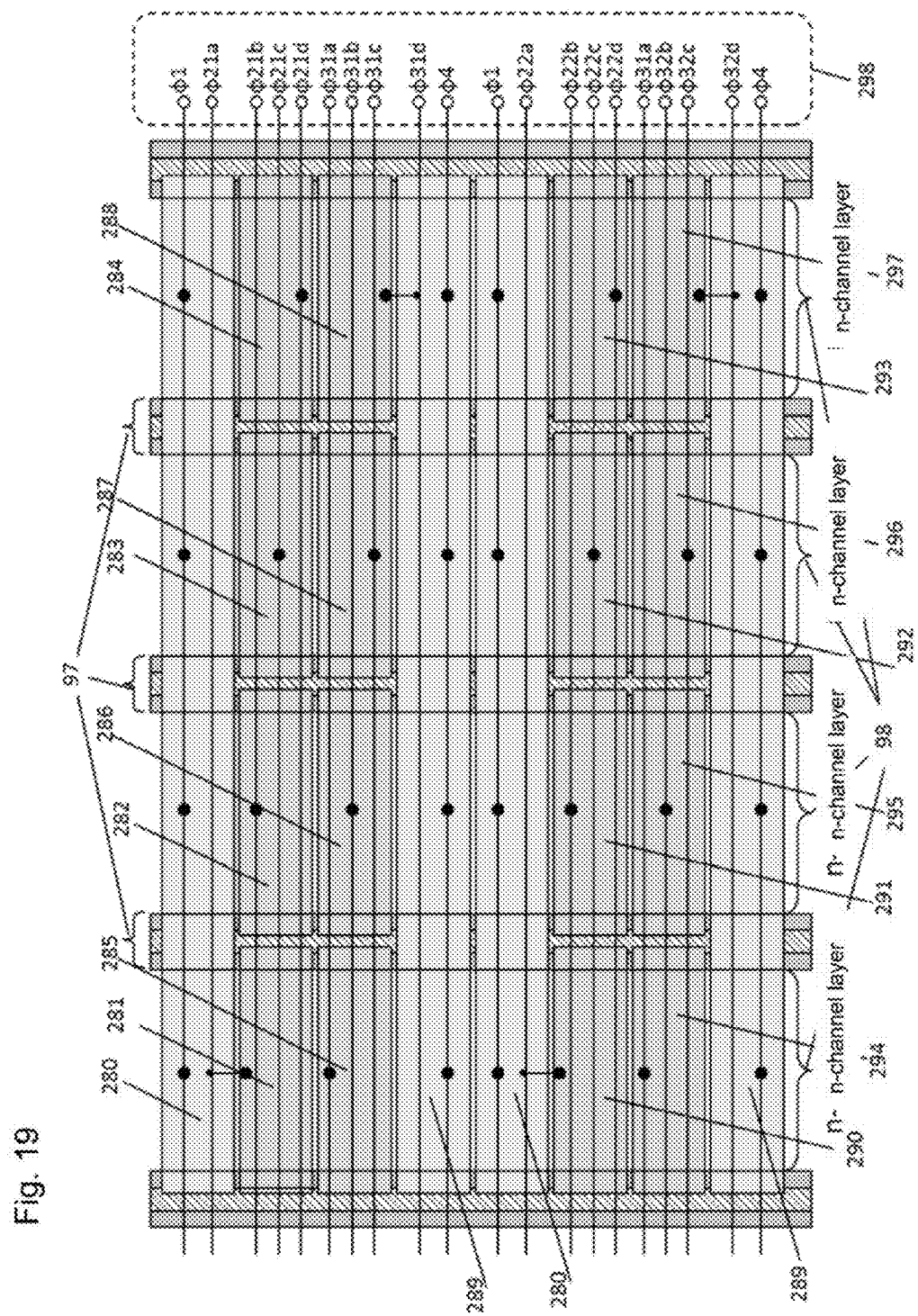
FIG. 19 is a partial plane view showing a geometric formation of electrodes and wires to deliver driving voltages in a second embodiment.
Figure 20:
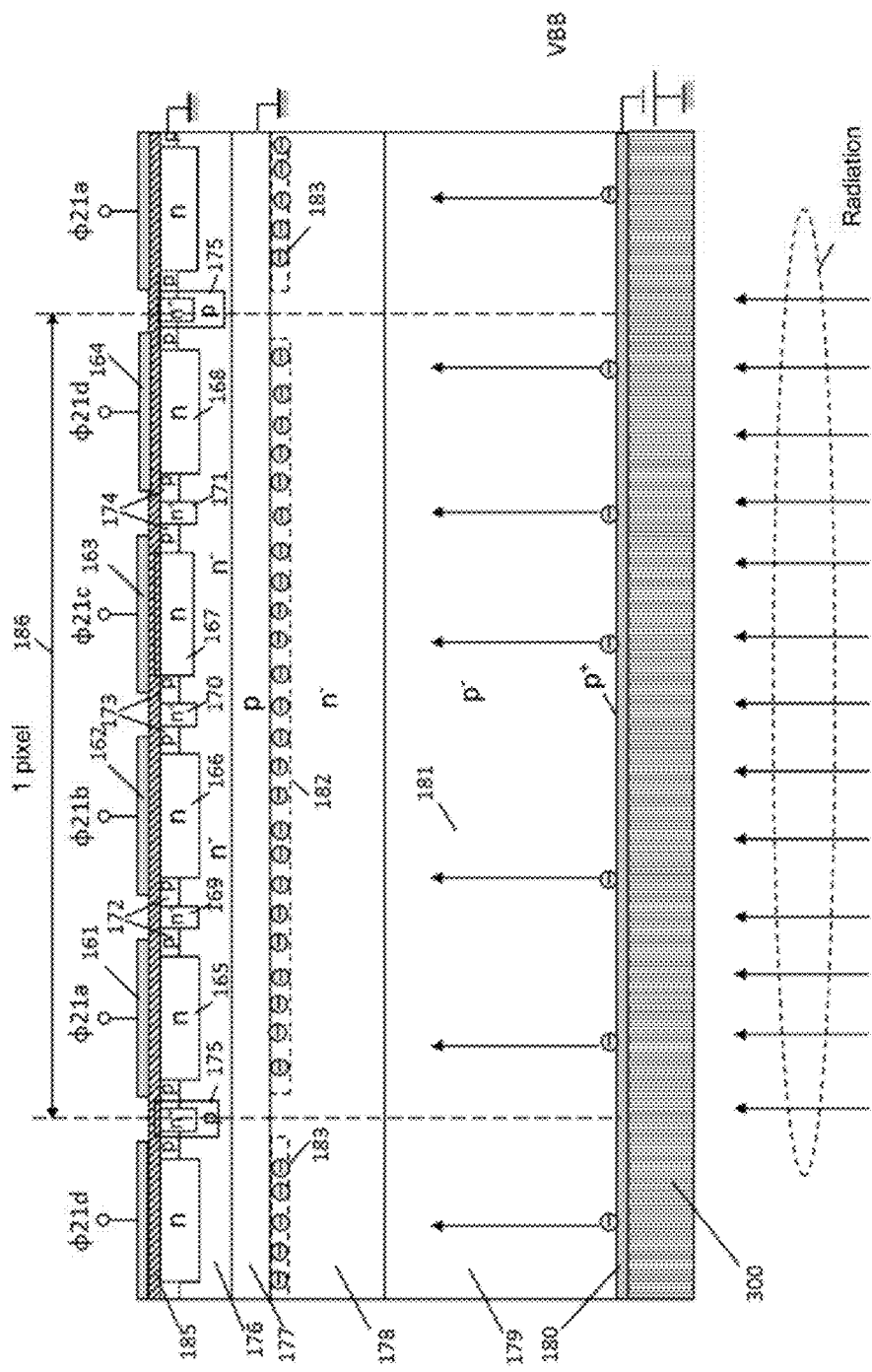
FIG. 20 is a schematic cross-section view of one pixel in a horizontal direction of a third embodiment.

FIG. 19 shows a detailed partial plane structure of a second embodiment of this invention. φ21a, The second embodiment utilizes a four-phase transfer, in which one CCD stage for collection and transfer of signal charges consists of four electrodes.

Transfer electrodes 280 controlled with a φ1 transfer pulse commonly lies on all vertical transfer channels. Transfer electrodes 289 controlled with a φ4 transfer pulse commonly lies on all vertical transfer channels.

Transfer electrodes 281, 282, 283 and 284 respectively controlled with φ21a, φ21b, φ21c and φ21d are electrically independent electrodes, each of which lies on a different vertical transfer channel. Transfer electrodes 285, 286, 287 and 284 respectively controlled with φ31a, φ31b, φ31c and φ31d are electrically independent electrodes, each of which lies on a different vertical transfer channel. Similarly, electrodes 290 to 293 and 294 to 297 are respectively controlled with φ22a to φ22d and φ32a to φ32d.

The vertical channels 98 are separated with separation layers 97. Control pulses to control the charge collection and the transfer are supplied through terminals 298. Wires to transfer control pulses to the electrodes shown with straight wires and contact points shown with black points connecting the wires and the electrodes are not explained, which are similar to those explained for FIG. 9.

In the second embodiment, for example, since one transfer stage consists of four electrodes controlled with φ1, φ21a, φ31a and φ4, charges can be collected with two neighboring electrodes φ21a and φ31a. Therefore, as the charges are collected with a half area of one transfer stage (⅓ in the first embodiment), they can be collected more efficiently. Furthermore, in the second embodiment, charges are stored in at least two electrodes even during the transfer (one electrode among three in the first embodiment). Therefore, if the length of one CCD stage of the first embodiment is equal to that of the second embodiment, the charge handling capacity of the second embodiment is one and a half times the charge handling capacity of the first embodiment.

However, wiring density of the second embodiment is higher than that of the first embodiment. For example, for 4 columns of the channels, ten supply wires are necessary for the second embodiment, while six lines are necessary for the first embodiment. Therefore, two embodiments can be alternatively employed, depending of the pixel size, a number of the frames and the maximum charge handling capacity required for each application.

(Third Embodiment)

FIG. 3 illustrates the third embodiment of this invention. The third embodiment is featured with a special energy conversion layer 300 attached to the backside of the semiconductor.

Various layers and devices can be attached to the backside of the embodiment of this invention, such as an electron avalanche layer to multiply electrons generated by the incident radiation, a fluorescence film to absorb energy of incident radiation and emit fluorescence light which is then injected to the semiconductor to generate electrons, and an organic or inorganic photoelectron conversion film absorbing radiation with a particular wave range to emit electrons.

Details of the special backside layers are not explained here. Conditions of the imaging device, such as a bias voltage level, thickness of the layer, structures of the backside and electrodes, widely range, depending on the types of the energy conversion layers. The thickness of the semiconductor can be much thinner for an appropriate condition.

(Other embodiments)

Embodiments of this invention are not limited to those explained above.

(Discharge from the backside)

For example, electrons (holes) stored in the bulk storage layer can be extracted to the backside to reset the semiconductor by applying a positive voltage to the backside, instead of the negative standard voltage (−VBB), to recombine the electrons (holes) with holes (electrons) supplied from the backside.

(CMOS Type)

Furthermore, this invention is not limited to the CCD-type devices, but can be applied to CMOS-type devices. For the CMOS devices, signal charges of each frame can be also selectively collected at a very short time interval ti by inserting the potential barrier with controllable potential between the charge collection layer and the bulk storage layer, and independently operating a plurality of the charge collection devices in each pixel.

A pixel of the CMOS device contains a CMOS signal transfer device next to each of the plurality of the charge collection devices in each pixel. The signal charge packets can be transferred after conversion to signal voltages or digital signals.

(Second signal storage and signal storage outside a pixel)

Furthermore, a second signal storage after each signal storage and transfer device can be installed. A signal readout device is installed after the second signal storage to output signals to outside of the pixel.

The second storage device of a CCD sensor also works as a signal transfer device.

In a CMOS signal transfer device, a drain is included in the signal transfer circuit.

It is preferable to install k signal storage elements to each signal transfer device, where k is equal to or greater than 1.

When m, a number of charge collection devices of each pixel, is large enough, one charge packet collected by a charge collection device can be transferred during charge collection by the other (m−1) charge collection devices, which takes (m−1)tc, where tc is the charge collection time. By repeating the operation at each charge collection device, the charge collection device can collect a charge packet, transfer it to one of k storage elements, and become empty again before the next charge collection. By repeating the operation, a series of image signals for m times (k+1) frames are stored inside each pixel.

Spatial alignment of the m charge collection devices is not limited to that of the first embodiment, in which the charge collection devices are placed in an equally distributed two dimensional array. They can be placed in line.

(Radial alignment)

The charge collection devices can be placed around the pixel center, and the transfer device and a signal storage device can be placed in a radial alignment. In the case, the potential barrier can be thinned over the charge collection devices in the central area of the pixel and thickened on the periphery of the pixel, which creates a field toward the pixel center from the periphery to collect charges in a shorter time and to achieve a much higher frame rate.

(Definition of a pixel)

For the case of uniformly distributed collection devices in a space such as the first embodiment, a pixel is not necessarily fixed at the same position. A pixel area at each instance is defined as a space surrounded by lines connecting mid points of the lines connecting the charge collection devices collecting charges at the instance. Therefore, the position of the pixel shifts for different frames, keeping the same distance between the pixel centers. The shift is compensated by a post digital image processing.

(Stacked sensor)

The sensor can be a stacked one by making the signal storage devices and the following readout devices on a different chip.

(Introduction of electron multiplication device)

In ultra-high-speed imaging, it is required to increase sensitivity as high as possible for compensation unsufficient incident light. It is desirable to introduce electron avalanche or impact ionization to multiply signal electrons in an element in the sequence from the photoelectron conversion of incident light to the final output of the image signals from the image sensor chip. The signal electron multiplication includes impact ionization due to collision of accelerated electrons, an MCP (an micro-channel plate), an avalanche photodiode, and an EMCCD (multi-step impact ionization on a CCD channel). They are all prior arts.

(Sensors using holes as signal charges)

Naturally, the signals can be holes instead of electrons. In the case, the type of the semiconductor (n-type or p-type) and the electric polarity (+ or −) should be exchanged.

Hereafter, examples of other embodiments of this invention are explained.

(Fourth Embodiment)

The fourth embodiment is featured with the second signal storage and the signal storage outside the pixel.

A charge packet collected by a charge collection device can be transferred during charge collection by the other (m−1) charge collection devices, which takes (m−1)tc, where tc is time required for charge collection.

The fourth embodiment comprises eight charge collection devices (m=8).

For simplifying the explanation, it is assumed that a transfer time tt from a collection device is shorter than 4 times a collection time tc. The fourth embodiment comprises two groups of collection devices, each contains four collection devices. After sequential charge collection by four of the eight collection devices belonging to the first group at a time interval of tc in turn, the charge collected by the four collection devices of the first group are simultaneously transferred to the second storage devices during 4tc, in which the rest of the four collection devices belonging to the second group are collecting charges in turn.

Then, the collection devices in the first group are empty and can collect charges in turn at the time interval tc.

By repeating the operation, the image signals for 8j consecutive frames can be captured at the frame interval tc, where j is an integer equal to or greater than 2. The frame rate is a theoretically achievable maximum frame rate.

Figure 22:
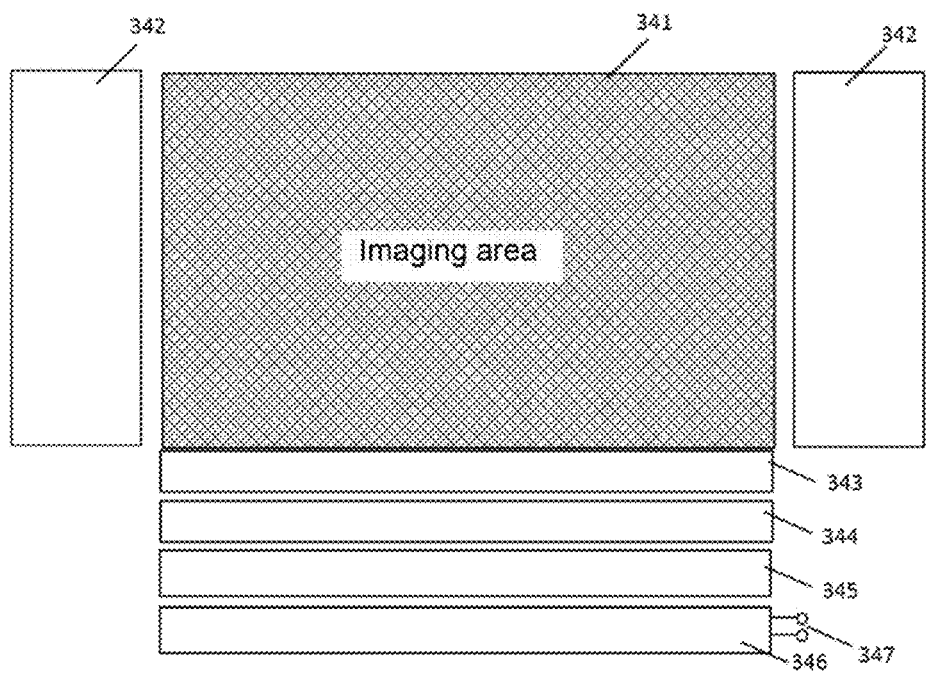
FIG. 22 is a schematic plane view of a fourth embodiment of an imaging apparatus of this invention.

Hereafter, the fourth embodiment is explained in detail. FIG. 22 is the overall structure of the fourth embodiment.

An imaging part 341 has a backside illumination structure which converts light incident on a backside (from the backside of the page in the figure) to signal charges, stores them and applies current amplification to them.

A control part 342 includes a control device to supply signals to operate a plurality of pixels comprising the imaging part, an analogue signal processor 343 to amplify analogue signals generated in the pixels with noise reduction, an AD conversion part 344 to convert the analogue signals to digital signals, a line memory part 345 to temporarily store the digital signals, and a communication tool 346 to transfer the digital signals stored in the line memory to the outside through output ports 347, such as LVDS.

The peripheral circuitry comprises circuits commonly used in conventional CMOS image sensors.

Figure 23:
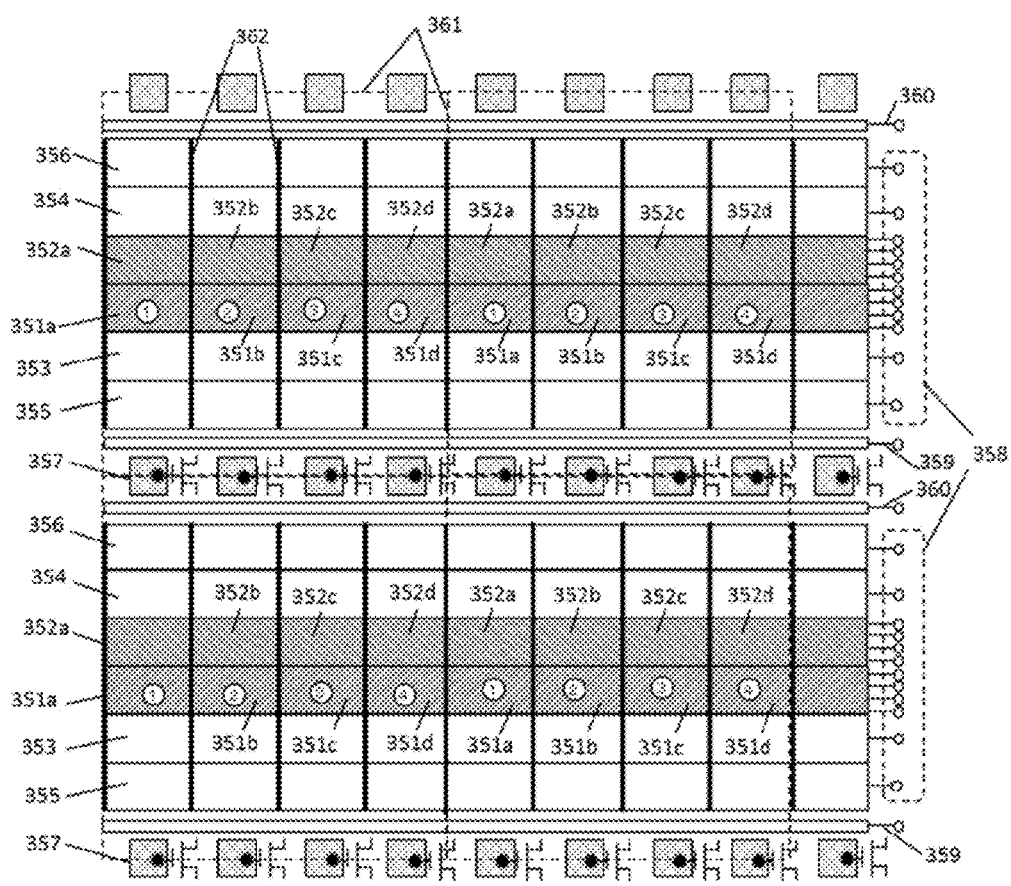
FIG. 23 is a schematic view showing plane architecture of two pixels of the fourth embodiment.
Figure 24:
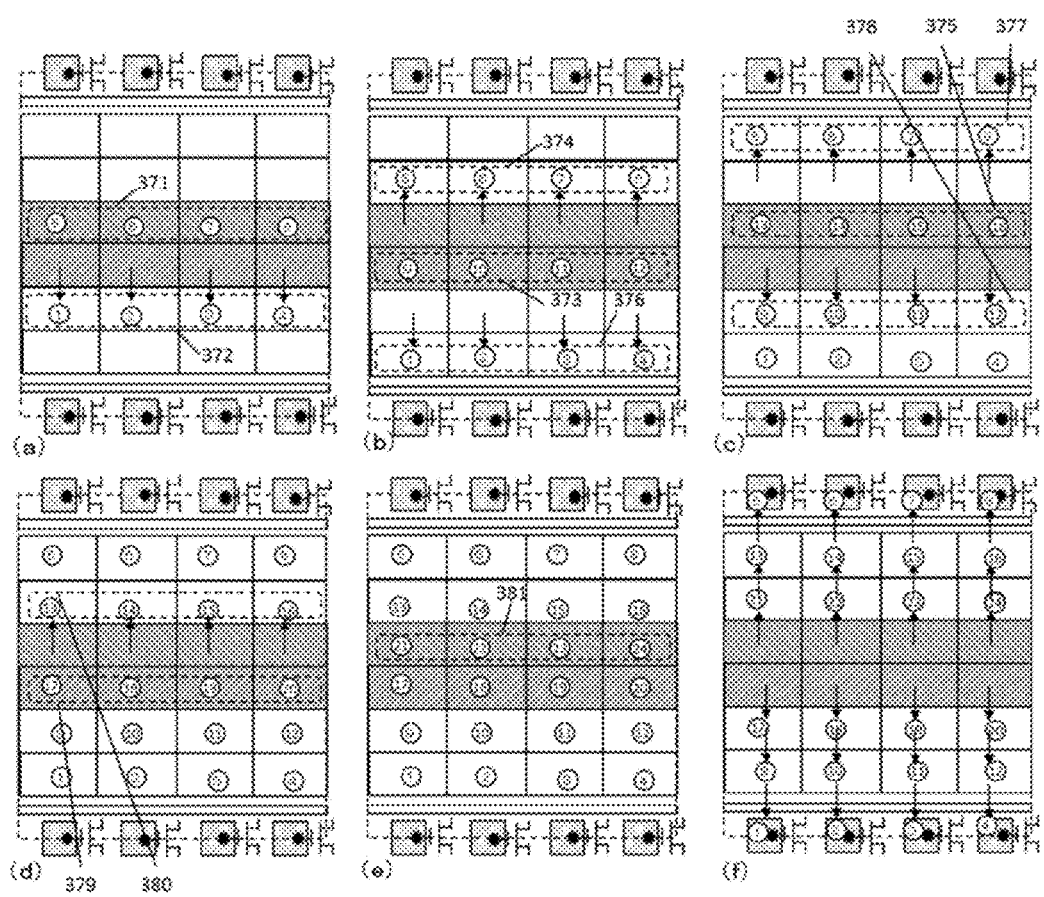
FIG. 24 shows an explanatory diagram for explaining an operation mode of the fourth embodiment.

FIG. 23 and FIG. 24 respectively illustrate a plane structure and an operation mode of the pixel of this embodiment. One pixel is defined with an area surrounded by a dotted line (a pixel boundary). The first group of four electrodes consists of the charge collection electrodes 351*a*, 351*b*, 351*c* and 351*d*, which are electrically independent on each other. An electrode 353 and an electrode 355 are respectively a first and a third charge transfer storage electrodes which receive and store the signal charges collected under the first group of the electrodes.

The second group of four electrodes consists of the charge collection electrodes 352*a*, 352*b*, 352*c* and 352*d*, which are electrically independent on each other. An electrode 354 and an electrode 356 are respectively a second and a fourth charge transfer storage electrodes which receive and store the signal charges collected under the second group of the electrodes 352*a* to 352*d*.

An output part 357, shown as a simplified model, converts the signal charges to the voltage signals and transfers them to the analogue signal processor.

Transfer control electrodes 359 and 360 selectively output the signal charges respectively from the third and the fourth charge transfer storage electrodes 355 and 356 to the output part. Terminals 358 supply driving voltages to all electrodes.

A separation part 362 electrically splits the transfer channels of the signal charges vertically. Hereafter, the operation mode of the fourth embodiment is explained.

At first, a charge collection pulse (a high voltage VH) is applied in turn to the first-group charge transfer storage electrodes 351*a*, 351*b*, 351*c* and 351*d* with a time interval ti. The signal charges (1) to (4) in FIG. 23 (the numbers enclosed with a circle in the figures are represented with bracketed ones in the text) are collected in an order of (1), (2), (3) and (4) with the time interval ti and temporarily stored respectively by the first-group electrodes 351*a*, 351*b*, 351*c* and 351*d*.

FIG. 24 illustrates the next operation. In FIG. 24(*a*), a charge collection pulse (a high voltage VH) is applied in turn to the second-group charge transfer storage electrodes 352*a*, 352*b*, 352*c* and 352*d* with a time interval ti. The signal charges (5) to (8) are collected in an order of (5), (6), (7) and (8) with the time interval ti and temporarily stored respectively by the second-group electrodes 352*a*, 352*b*, 352*c* and 352*d*.

In the case, a time between charge collections of (4) and (5) is also ti. During the charge collection by the second-group electrodes, a group of the signal charges 357 ((1) to (4)) temporarily stored in the first-group electrodes are transferred to the first charge transfer storage electrodes 353 simultaneously in parallel. A time interval 4ti can be allocated for the parallel transfer.

Then, as shown in FIG. 24(*b*), the charge collection pulse (a high voltage VH) is applied in turn to the first-group charge transfer storage electrodes 351*a*, 351*b*, 351*c* and 351*d* with a time interval ti to collect signal charges (9) to (12). The time between charge collections of (8) and (9) is ti. The time to collect the signal charges (9) to (12) is 4 ti. During the 4 ti, the group of the signal charges 371 ((9)-(12)) temporarily stored under the second-group charge collection electrodes 352a to 352d are transferred to the second charge transfer storage electrodes 353 in parallel, as shown as a group of signal charges 374, and, at the same time, the group of the signal charges (1) to (4) temporarily stored under the first-group charge collection electrodes 351a to 351d are transferred to the third charge transfer storage electrodes 355 in parallel, as shown as a group of signal charges 376.

Similarly, as shown in FIG. 24(c), a signal charge group 375 ((13) to (16)) is collected and the signal charge group 376 ((9) to (12)) is transferred in parallel. Then, as shown in FIG. 24(d), a signal charge group 379 ((17) to (20)) is collected and the signal charge group 380 ((13) to (16)) are transferred in parallel. Then, as shown in FIG. 24(e), a signal charge group 381 ((21) to (24)) is collected by the second-group charge transfer storage electrodes, and the signal charges (1) to (24) are stored in each charge transfer storage electrode on one pixel. The signal charges (1) to (24) of each pixel consist of the signal charges for consecutive twenty four frames taken at the frame interval ti.

At first, the signal charges (1) to (4) are transferred to the output part 357, converted to analogue voltage signals and transferred to the analogue signal processor. Then, the signal charges (5) to (8) are transferred to the output part 357 and converted to analogue voltage signals.

FIG. 24(f) depicts the sequential transfer of the signal charges. In the case in which the output part 357 comprises two independently operated output circuits, the signal charges (1) to (4) and (5) to (8) are transferred to the output part in parallel. The signal charges read out of the sensor by repeating the operation provide 24 consecutive frames captured theoretically at the frame rate of (1/ti) fps, theoretically.

For example, in an ideal case in which tt is less than 4 ti and ti is 5 nanoseconds, where tt is a time required to transfer four signal charges in parallel and ti is a time for collection of one signal charge packet, 200,000,000 frames per second is achieved. Since, in most of practical cases, tt is longer than 4 ti, the frame interval is tt/4 (>ti). The theoretical minimum frame interval of conventional in-situ storage image sensors without this invention is (tt+ti), and the frame rate is the inverse. Therefore, this invention achieves more than a four-time-higher frame rate.

(Fifth Embodiment)

The fifth embodiment is further featured by "a radial alignment" ([154]) in which the charge collection devices are placed around the center of each pixel and a transfer device and a charge storage device are placed in a space radially extending outward from each charge collection device, as well as the feature explained above, the second signal storage ([147]).

In the case, the potential barrier can be thinned over the charge collection devices in the central area of the pixel and thickened on the periphery of the pixel, which creates a field toward the pixel center from the periphery to collect charges in a shorter time and to achieve a much higher frame rate. This is another advantageous feature.

Since a general structure of the fifth embodiment in the depth direction is the same as the fourth embodiment, the explanation is omitted.

Figure 25:
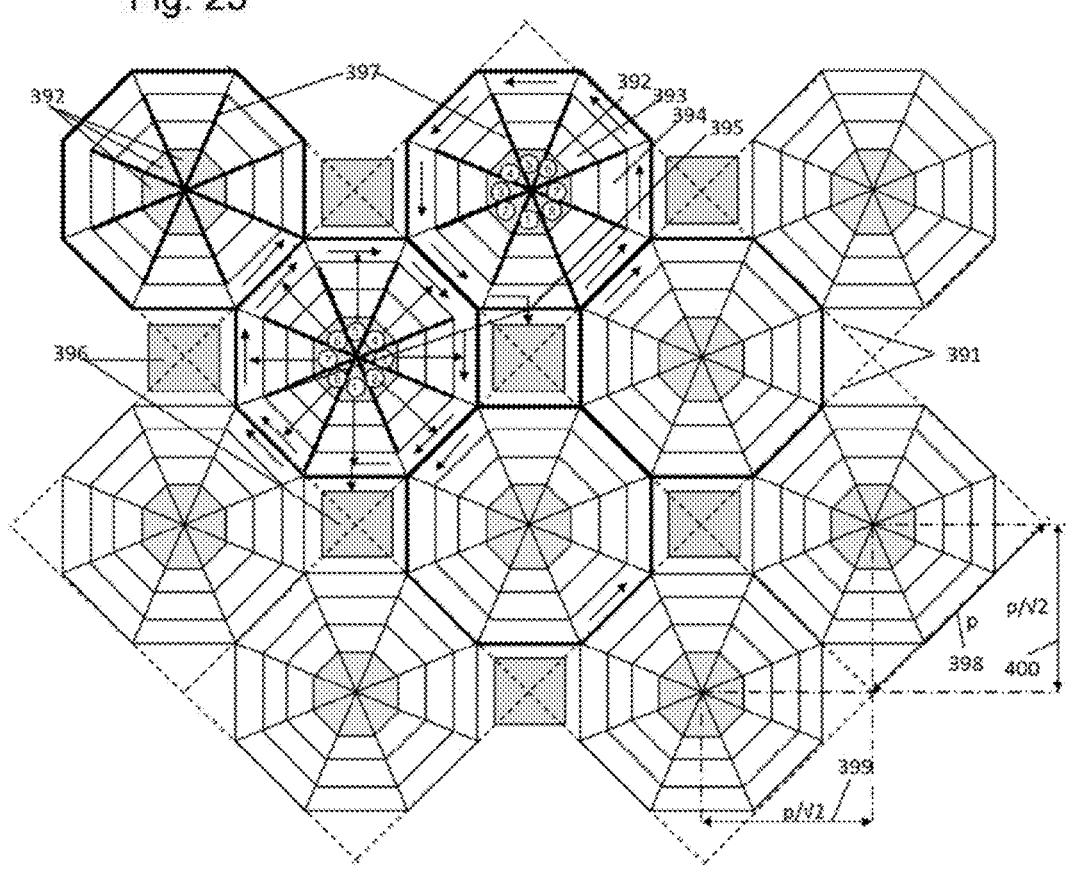
FIG. 25 is a partial plane view showing a geometric formation of a fifth embodiment of this invention.

FIG. 25 shows a partial plane layout of the fifth embodiment.

Dotted lines 391 define a pixel array composing square pixels rotated at 45 degrees. In each pixel, there are eight charge collection electrodes 392, each with a triangular shape, which are electrically independently operated. A first charge transfer storage electrode 393, a second charge transfer storage electrode 394, and a third charge transfer storage electrode 395 are placed in the outer space of each charge collection electrode.

The third charge transfer storage electrode 395 consists of a plurality of elements, which are later explained. A space 396 is an output part. Lines 397 are separations to transfer charges in a radial direction.

In the layout, the eight charge collection electrodes form an octagonal shape (hereafter, we employ a regular octagon). The octagons pave a plane space with a square on which an output part is placed. Then, the space is efficiently utilized. The octagons are aligned in a staggered alignment.

Length of an edge of the pixel 398 is p. A horizontal pixel pitch 399 and a vertical pixel pitch 400 are both 1/(square root of 2) as seen in the figure.

Therefore, a spatial sampling pitch of an image reduces to 1/(square root of 2) and a spatial resolution increases to (square root 2) times both in horizontal and vertical directions. This is another advantageous feature of fifth embodiment.

The most important feature of the fifth embodiment is that the charge collection electrodes 392 are locally placed in the central area of the pixel. The localization leads to effective reduction of the charge collection time. The details are explained later referring to FIG. 28.

Figure 26:
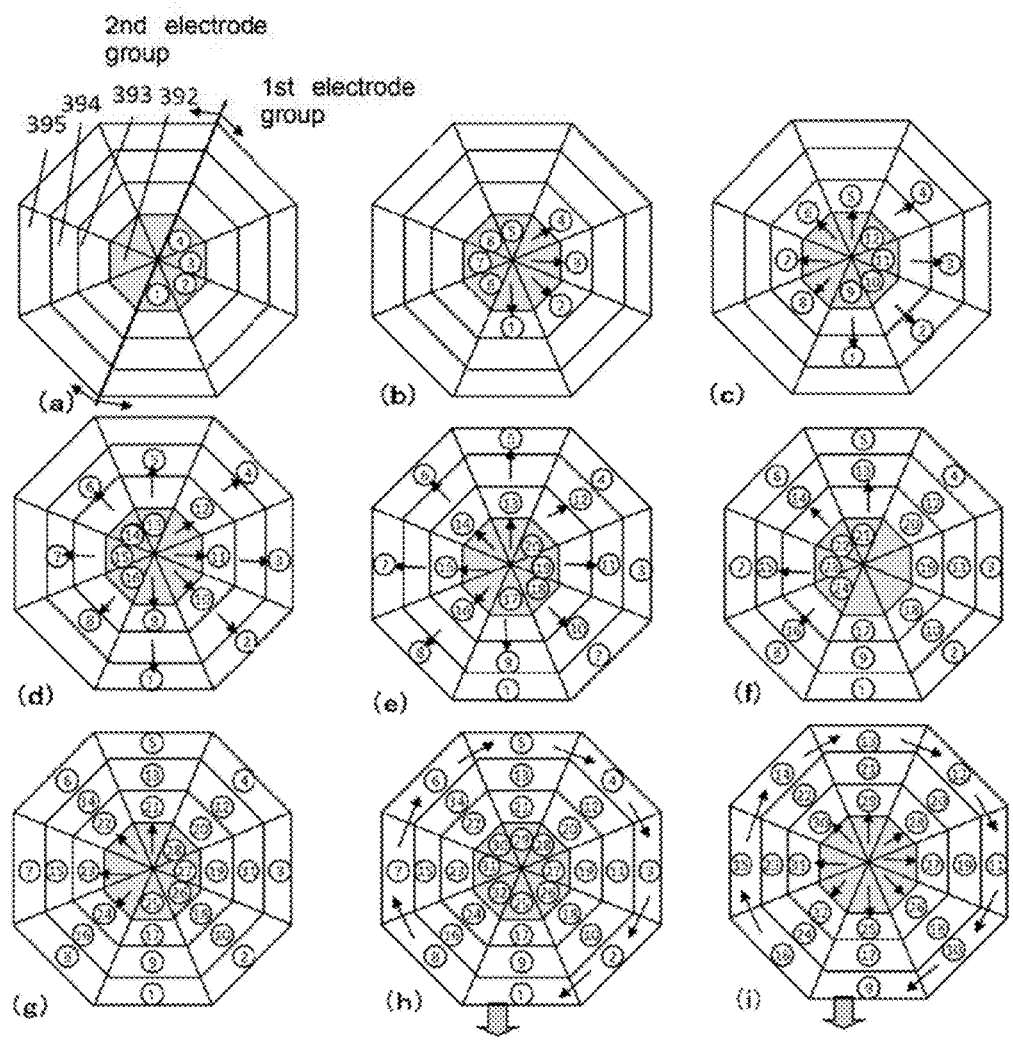
FIG. 26 is a view illustrating explanatory diagrams of one pixel of the fifth embodiment for explaining an operation mode in the pixel.
Figure 27:
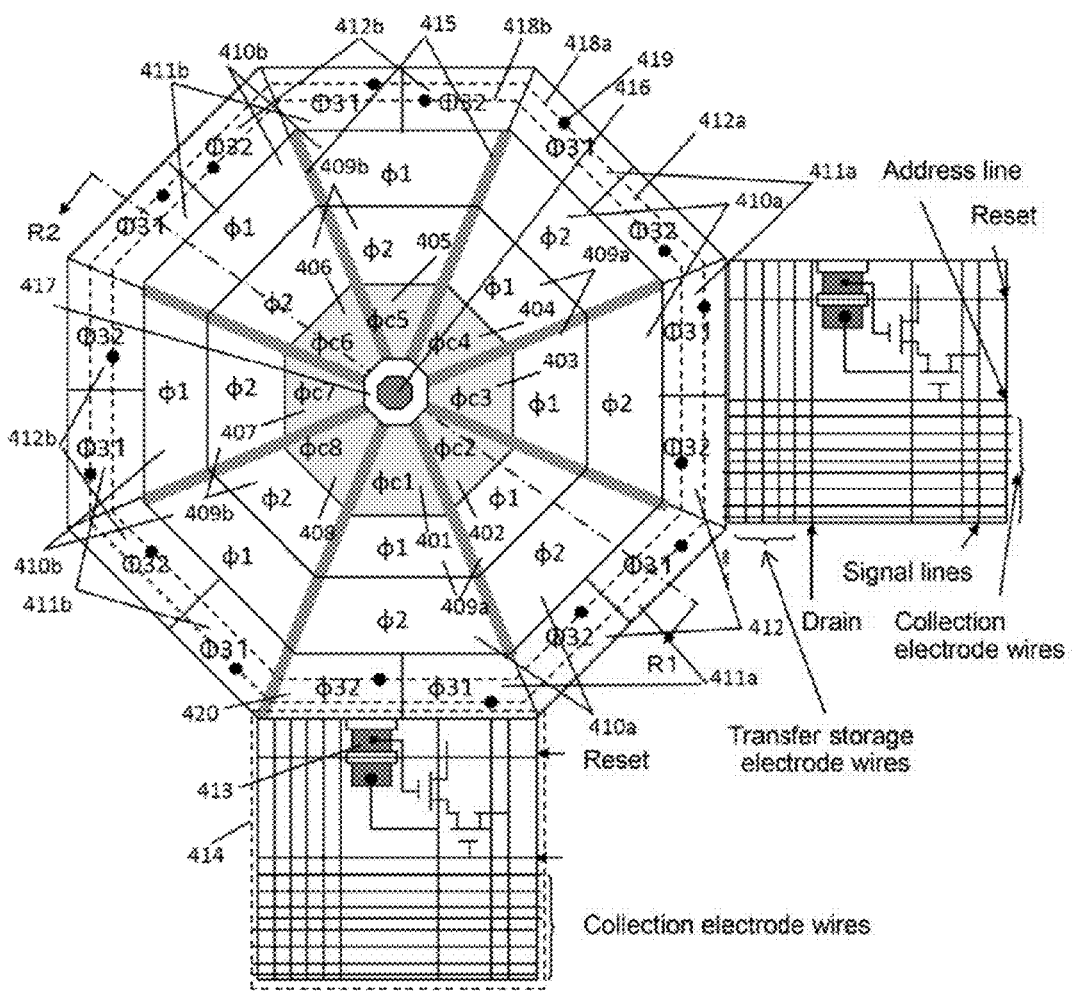
FIG. 27 is a view illustrating a detailed structure of the pixel of the fifth embodiment.
Figure 28:
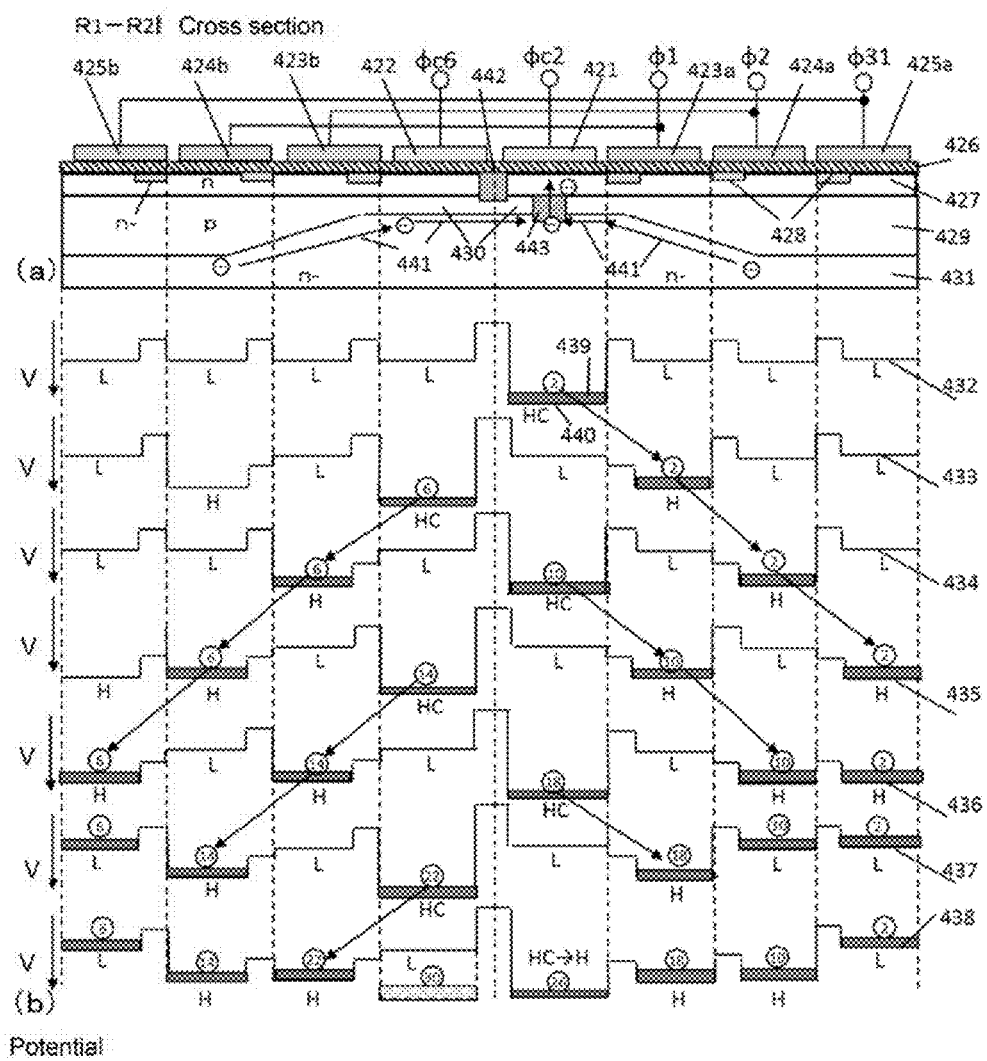
FIG. 28 is a schematic cross-sectional view and potential profiles of one pixel of the fifth embodiment for explaining a transfer operation mode.

Hereafter, an operation mode of the embodiment is explained referring to FIG. 26, FIG. 27 and FIG. 28.

FIG. 26(a) to FIG. 26(i) illustrates a transfer scheme of signal charges. At first, as shown in FIG. 26(a), signal charges are collected four times by charge collection electrodes 392 in the order of (1), (2), (3) and (4) at a frame interval ti, and the signal charges (1) to (4) are stored under the charge collection electrodes. A first group of the charge collection electrodes is defined as the electrodes to collect the signal charges (1) to (4).

Then, as shown in FIG. 26(b), signal charges are collected four times by charge collection electrodes 392 in the order of (5), (6), (7) and (8) and are stored under the electrodes. During the collection of the four signal charges, 4 ti, the signal charge (1) to (4) are transferred in parallel to the first charge transfer storage electrodes adjacent to the first group of the charge collection electrodes. A time interval between collection of (4) and (5) is also ti. A second group of the charge collection electrodes is defined as the electrodes to collect the signal charges (5) to (8).

As shown in FIG. 26(c), the first-group electrodes collect signal charges in the order of (9), (10), (11) and (12) at the frame interval ti. Simultaneously, the signal charges (1) to (4) are transferred in parallel to the second charge transfer storage electrodes 394 of the first-group charge collection electrodes, and the signal charges (5) to (8) are transferred in parallel to the first charge transfer storage electrodes 394 of the second-group charge collection electrodes.

As shown in FIG. 26(d), the second-group electrodes collect signal charges in the order of (13), (14), (15) and (16) at the frame interval ti. Simultaneously, the signal charges (1) to (4) are transferred in parallel to the third charge transfer storage electrodes 395 of the first-group charge collection electrodes, the signal charges (5) to (8) are transferred in parallel to the second charge transfer storage electrodes 394 of the second-group charge collection electrodes, and the signal charges (9) to (12) are transferred in parallel to the first charge collection storage electrodes 393 of the first-group charge collection electrodes.

As shown in FIG. 26(e), the first-group electrodes collect signal charges in the order of (17), (18), (19) and (20) at the frame interval ti. Simultaneously, the signal charges (5) to (8) are transferred in parallel to the third charge transfer storage electrodes 395 of the second-group charge collection electrodes, the signal charges (9) to (12) are transferred in parallel to the second charge transfer storage electrodes 394 of the first-group charge collection electrodes, and the signal charges (13) to (16) are transferred in parallel to the first charge transfer storage electrodes 393 of the second-group charge collection electrodes.

As shown in FIG. 26(*f*), the second-group electrodes collect signal charges in the order of (21), (22), (23) and (24) at the frame interval ti. Simultaneously, the signal charges (13) to (16) are transferred in parallel to the second charge transfer storage electrodes 394 of the second-group charge collection electrodes, the signal charges (17) to (20) are transferred in parallel to the first charge transfer storage electrodes 393 of the first-group charge collection electrodes.

As shown in FIG. 26(*g*), the first-group electrodes collect signal charges in the order of (25), (26), (27) and (28) at the frame interval ti. Simultaneously, the signal charges (21) to (24) are transferred in parallel to the first charge collection storage electrodes 394 of the second-group charge collection electrodes.

As shown in FIG. 26(*h*), the second-group electrodes collect signal charges in the order of (29), (30), (31) and (32) at the frame interval ti. The operation described above fills up all charge collection electrodes and the charge transfer storage electrodes with signal charges. Then, a series of image signals for consecutive 32 frames are stored in each pixel.

The third charge transfer storage electrodes of both the first-group and the second-group electrodes can transfer the signal charges either in a clockwise or an anticlockwise direction along the most outer electrodes of each octagon. With this rotational transfer, the signal charges (1), (2), (3), ..., (8) are transferred to the output part 396 in this order from the third charge transfer storage electrodes, converted to voltage signals in the output part, and then transferred to the analogue signal processor.

The third charge transfer storage electrodes 395 are now empty after the rotational transfer of the signal charges (1) to (8). Then, as shown in FIG. 16(*i*), the signal charges (9) to (16) stored under the second charge transfer storage electrodes 394 are transferred outward at once in parallel to the third charge transfer storage electrodes 395, and, simultaneously, the signal charges (17) to (24) stored under the first charge transfer storage electrodes 393 and the signal charges (25) to (32) stored under the charge collection electrodes 392 are respectively transferred to the second and the first charge transfer storage electrodes.

The signal charges (9) to (16) under the third charge transfer storage electrodes are transferred by a rotational transfer to the output part as explained in the explanation of FIG. 26(*h*). The third charge transfer storage electrodes are now empty, to which the signal charges (17) to (24) are transferred.

By repeating the operation, all signal charges (1) to (32) are transferred to the analogue signal processor as the voltage signals.

FIG. 27 shows a simplified plane structure of one pixel.

The first-group collection electrodes 392 in FIG. 25 and FIG. 26 include the electrodes 401 to 404 respectively operated with collection operation pulses ϕc1 to ϕc4. The second-group collection electrodes consist of the electrodes 405 to 408 respectively operated with collection operation pulses ϕc5 to ϕc8. An electrode 409*a* is the first charge transfer storage electrodes of the first-group electrodes and is operated with the transfer control pulse ϕ1. An electrode 409*b* is the first charge transfer storage electrode of the second-group electrodes and is operated with the transfer control pulse ϕ2. An electrode 410*a* is the second charge transfer storage electrodes of the first-group electrodes and is operated with the transfer control pulse ϕ2. An electrode 410*b* is the second charge transfer storage electrode of the second-group electrodes and is operated with the transfer control pulse ϕ1.

Electrodes 420, 411*a* and 412*a* are the third charge transfer storage electrodes of the first-group electrodes. Electrodes 411*b* and 412*b* are the third charge transfer storage electrodes of the second-group electrodes. The electrodes 411*a* and 411*b* are operated with transfer control pulse ϕ31, and the electrodes 420, 412*a* and 412*b* are operated with transfer control pulse ϕ32.

A floating diffusion (hereafter, FD) 413 receives a signal charge packet from the transfer electrode 420 and converts it to a voltage signal.

The output part 414 surrounded by dotted lines comprises the FD, a current amplification circuit, an address circuit, and a reset circuit, and so forth. The wide bold lines 415 define a radially extending charge transfer group.

The drain 416 locates around the center of the pixel. An overflow control electrode 417 discharges excess charges from the collection electrodes. Dotted lines 418*a* and 418*b* are examples of in-pixel wirings to supply the control pulses ϕ31 and ϕ32, and connected to the electrodes at contact points 419 shown with black points. Charges generated by photoelectric conversion of light incident on the backside are stored in a bulk CCD, and instantly absorbed by the drain when a high voltage applied to the drain 416 of each pixel.

An image capturing starts from the absorption operation similar to the operation illustrated in FIG. 15. The transfer after the start is illustrated in FIG. 26.

The outmost third charge transfer storage electrodes are operated as a two-phase CCD. Each electrode consists of a pair of electrodes 411*a* or 411*b* and 412*a* and 412*b* with a pair of control pulses ϕ31 and ϕ32. The electrodes are also operated for the two-phase transfer. The complementary two-phase pulses ϕ31 and ϕ32 transfer the signal charges in the clockwise direction along the periphery of the pixel in this case.

Similarly, the first and the second transfer storage electrodes are also operated as two-phase CCDs. The operation is explained, referring to FIG. 28.

FIG. 28(*a*) shows a cross-section structure along the cut line R1 to R2 shown in FIG. 27.

The electrode 421 is the charge collection electrode of the first-group electrodes (the electrodes 402 in FIG. 27) operated with ϕc2. The electrode 422 is the charge collection electrode of the second-group electrodes (the electrodes 406 in FIG. 27) operated with ϕc4. The first transfer storage electrodes 423*a* and 423*b*, respectively, of the first-group and the second-group electrodes are respectively operated with ϕ1 and ϕ2. The second transfer storage electrodes 424*a* and 424*b*, respectively, of the first-group and the second-group electrodes are respectively operated with ϕ1 and ϕ2. The third transfer storage electrodes 425*a* and 425*b*, respectively, of the first-group and the second-group electrodes are both operated with ϕ31.

An insulation layer is sandwiched by the electrodes and an n-type transfer channel 427. The transfer channel under each electrode includes a lower concentration part 428, which creates a two-phase CCD transfer channel with a potential step.

In a low-concentration substrate n⁻ layer 431, a thick p-well layer 429 and a thin p-well layer 430 are created. An actual semiconductor has an undrawn low-concentration substrate p layer under the low concentration substrate n layer 431 as shown in FIG. 12.

As explained in the explanation on FIG. 12, the n substrate and the p-well are under a reversely biased state, by which electrons are attracted toward the p-well. Then, a high voltage VH is applied to the charge collection electrode 421, which extends a depleted layer from the n channel 427 under the charge collection electrode 421 to the low-concentration n substrate 431 penetrating the thin p-well 430 between the layers 427 and 431, creating a punch-through state 443. Then, electrons are collected to the channel under the electrode 421 along a path shown with the arrows 441.

FIG. 28(b) shows potential profiles along the n channel at each time step in the operation. The potential profile 432 shows the state of the channel when a first high voltage pulse VH is applied to the control voltage φc2 of the collection electrode 421. A signal charge (2) 439 is formed in the channel beneath the collection electrode 421 by the high potential HC 440.

In the figure, L and H respectively represent channel potentials created by application of the low voltage VL and the high voltage VH to each electrode.

A potential 433 shows the state of the channel when the high voltage pulse VH is applied to the control voltage φc6 of the collection electrode 422, which locates on the opposite side of the collection gate 433. The signal charge (6) is formed in the channel beneath the collection electrode 422. At the same time, VL is applied to the electrode 421 and VH is applied to the electrode 423a. Then, the signal charge (2) is transferred to the channel beneath the electrode 423a.

A potential 434 shows a state of the channel when the high voltage pulse VH is applied to the control voltage φc2 of the collection electrode 421, again. The signal charge (10) is formed in the channel beneath the collection electrode 421. At the same time, VL is applied to the electrode 422 and VH is applied to the electrode 423b. Then, the signal charge (6) is transferred to the channel beneath the electrode 423b. At the same time, VL is applied to the electrode 423a and VH is applied to the electrode 424a. Then, the signal charge (2) is transferred to the channel beneath the electrode 424a.

A potential 435 shows a state of the channel when the high voltage pulse VH is applied to the control voltage φc6 of the collection electrode 422, again. The signal charge (14) is formed in the channel beneath the collection electrode 422. At the same time, VL is applied to the electrode 421 and VH is applied to the electrode 423a. Then, the signal charge (10) is transferred to the channel beneath the electrode 423a. At the same time, VL is applied to the electrode 423b and VH is applied to the electrode 424b. Then, the signal charge (6) is transferred to the channel beneath the electrode 424b. At the same time, VL is applied to the electrode 424a and VH is applied to the electrode 425a. Then, the signal charge (2) is transferred to the channel beneath the electrode 425a.

A potential 436 shows a state of the channel when the high voltage pulse VH is applied to the control voltage φc2 of the collection electrode 421, again. The signal charge (18) is formed in the channel beneath the collection electrode 421. At the same time, VL is applied to the electrode 422 and VH is applied to the electrode 423b. Then, the signal charge (14) is transferred to the channel beneath the electrode 423b. At the same time, VL is applied to the electrode 423a and VH is applied to the electrode 424a. Then, the signal charge (10) is transferred to the channel beneath the electrode 424a. At the same time, VL is applied to the electrode 424b and VH is applied to the electrode 425b. Then, the signal charge (6) is transferred to the channel beneath the electrode 425b.

A potential 437 shows a state of the channel when the high voltage pulse VH is applied to the control voltage φc6 of the collection electrode 422, again. The signal charge (22) is formed in the channel beneath the collection electrode 422. At the same time, VL is applied to the electrode 421 and VH is applied to the electrode 423a. Then, the signal charge (18) is transferred to the channel beneath the electrode 423a. At the same time, VL is applied to the electrode 423b and VH is applied to the electrode 424b. Then, the signal charge (14) is transferred to the channel beneath the electrode 424b.

A potential 438 shows a state of the channel when the high voltage pulse VH is applied to the control voltage φc2 of the collection electrode 421, again. The signal charge (26) is formed in the channel beneath the collection electrode 421. At the same time, VL is applied to the electrode 422 and VH is applied to the electrode 423b. Then, the signal charge (22) is transferred to the channel beneath the electrode 423b.

Then, VL is applied to the collection electrode 421 and VH is applied to the control voltage φc6 of the collection electrode 422. The signal charge (30) is formed in the channel beneath the collection electrode 422.

At the end of the above operation, all electrodes along the cross section are filled with the signal charges. In FIG. 27 there is a drain at the position 442 in FIG. 28. Since FIG. 28 is simplified figure mainly to explain the charge transfer, only the separation is drawn at the position.

In the fifth embodiment, signal charges generated by light incident on substantially a whole pixel area are induced toward the center of the pixel where the p-well is thinner. Then, the charges are sorted (selectively collected) by the high voltage applied to one of the collection electrodes around the center, where the potential under the p-well is kept slightly lower by the separation or the drain.

Hereafter, sizes of the parts, concentrations of the impurities, and so on, of the fifth embodiment are explained.

FIG. 30 shows a layout of the charge collection electrodes of the fifth embodiment. The pixel size is 10 and the thickness of the chip is 50 μm.

The substrate comprises low-concentration p and n double layers of a silicon single crystal grown by an epitaxial process. The surface layer is an n layer. The thickness is 12 um and the concentration is 2 times $10^{14}$ cm$^{-3}$. The rest of the backside layer is a p layer. The thickness is 38 um and the concentration is 2 times $10^{13}$ cm$^{-3}$.

Figure 32:
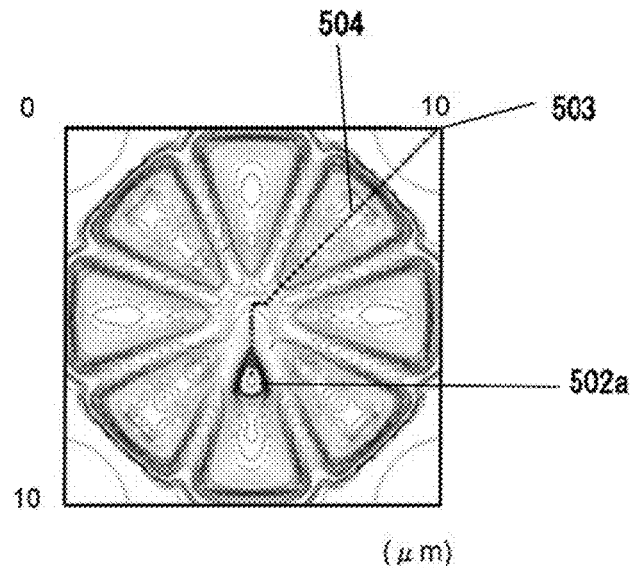
FIG. 32 is a view showing a plane potential profile of a channel layer in the sixth embodiment in a state in which a high voltage VH is applied to one of collection gates.
Figure 33:
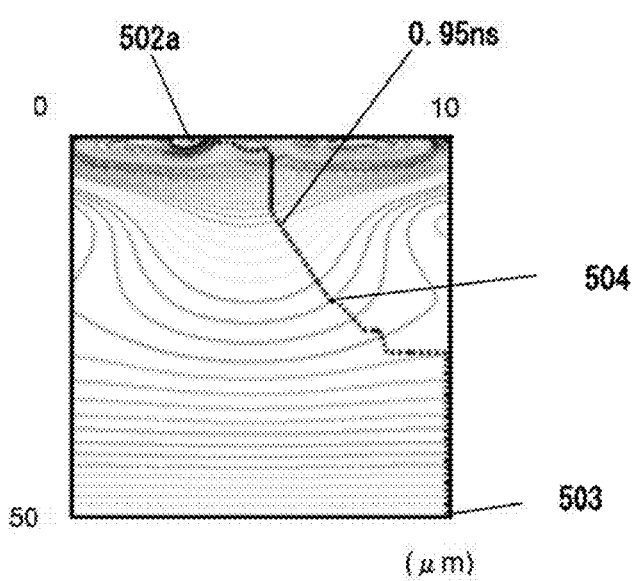
FIG. 33 is a cross-section view of the potential profile of a bulk and the channel layer of the sixth embodiment in a state in which a high voltage VH is applied to the collection gate.

FIG. 31 shows the layout of the masks 501 for implanting the p-well (429 in FIG. 28). The p-well functions as the potential barrier to prevent the signal charge (electrons in this embodiment) from migration to the channel beneath the charge transfer storage electrodes, and also as the guide to transfer the signal charges to the center of each pixel. The electrodes 502a to 502h in FIG. 31 correspond with the electrodes 401 to 408 in FIG. 27 and the electrodes 421 and 422 in FIG. 28. FIG. 32 and FIG. 33 show respectively a plane potential profile and a cross sectional profile upon application of VH to one of the collection electrodes 502a. FIG. 33 also shows a path 504 of an electric charge (an electron in this embodiment) generated at a farthest point 503 of the backside from the collection electrode 502a in a layer near the backside.

The p-well 501 shown in FIG. 31 is made by implant of Boron ions twice and thermal diffusion. The mask 505 for a first implant has a uniform shape with a hole 507 at the center. The mask 506 for a second implant comprises triangular strips with a star-like space spreading from the center. Though the mask shape is configured with straight lines, the final concentration profile after thermal diffusion is smoothly decreasing from the peripheral area to the central area, which drives the signal charges to the channel under the collection electrode in the central area in a short time. A mask 508 forms the separations of the channels (the separations 415 in FIG. 27) with a low-energy high-concentration implant of Boron ions.

At the final stage of the process, p-type ions (Boron ions) are implanted to the backside, forming a 0.1 μm thick high-concentration p layer, which is later activated by an ultra-violet ultra-short-pulse laser annealing (the layer is the p-type layer 180 in FIG. 12, but not drawn in the FIGS. 31 and 32).

The backside voltage is −31 V. A high voltage VH (=+4V) is applied to the electrode 502a one of the eight charge collection electrodes. A low voltage VL (=−4V) is applied to the other seven charge collection electrodes 502b to 502h.

The reverse bias voltage between the backside and the charge collection electrodes depletes the whole semiconductor layer except very thin layers at the backside and the front side, which drives the generated charges from the backside to the charge collection electrodes substantially in a direction perpendicular to the potential profile at a very high speed.

A simulation result shown in FIG. 32 and FIG. 33 proves that even an electron generated at the farthest point from a charge collection electrode arrives at the collection electrode at 0.95 ns (<1 ns). Therefore, theoretically, the frame rate of the consecutive image capturing can reach 1 Giga frames per second.

In the embodiment 5, the charge collection electrodes are also grouped to two groups of electrodes, which reduces the number of metal wires to control the image sensor. All thirty two electrodes in a pixel can be independently operated. In the case, the CMOS readout circuits are also independently operated, which requires about seventy metal wires on the pixel. A fine CMOS process enables placement of about three metal wires/μm. Therefore, a pixel size larger than 25 μm is sufficient to make a sensor with the independently operated charge collection electrodes. In the case, the signal charges collected by one of the eight charge collection electrodes, A, can be transferred from A during the collection of the signal charges by the rest of the seven charge collection electrodes. Order of the collection by the charge collection electrodes can be also arbitrarily decided, such as A, C, E, . . . , instead of A, B, C, . . . .

In the case, the theoretical highest frame rate can be achieved for the condition tt<7tc. Namely, the signal charges should be transferred from A to the first transfer storage electrode during the charge collection by the seven charge collection electrodes. Normally, tt>7tc. The frame rate for the case is (1/(tt+tc/7)) fps.

(Sixth Embodiment)

Figure 29:
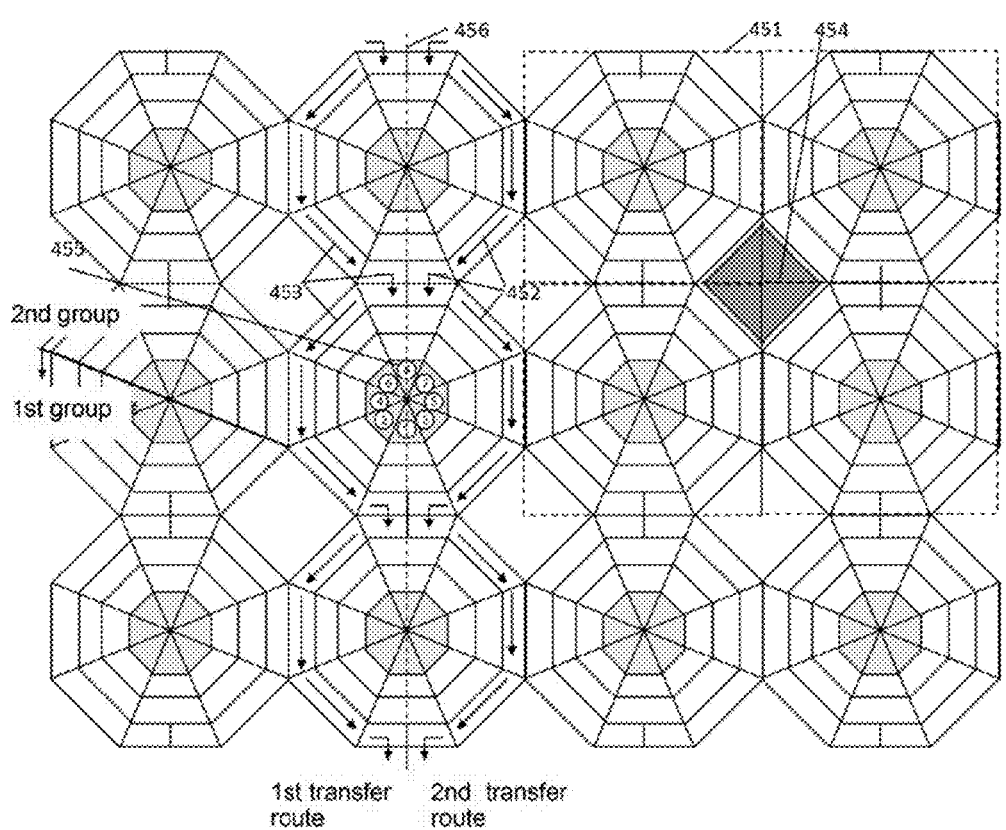
FIG. 29 is a partial plane view of a sixth embodiment of this invention.

FIG. 29 shows a partial plane structure of the sixth embodiment of this invention. The feature of this invention is that the octagons are arranged as a regular square array. The dotted lines 451 defines a pixel. Similar to the fifth embodiment, an output part is placed in a square 454 left after densely laying the octagons. The signal charges are converted to the voltage signals in the output part.

Signal charges of this embodiment can be easily read out along the outmost CCD channels without charge-voltage conversion in the output part. There are two CCD readout routes: a first transfer route on the right side, and a second transfer route on the left side, of a vertical line 456 connecting the centers of the pixels. The signal charges are transferred along the pair of the meandering routes in parallel.

An arrow 452 and an arrow 453 show respectively the chains of the transfer directions of the first and the second transfer routes. The signal charges 455 are collected in an order of (1), (2), (3), . . . , (7), (8).

The electrodes to collect and transfer the signal charges (1) to (4) are grouped to a first electrode group, and the electrodes to collect and transfer the signal charges (5) to (8) are grouped to a second electrode group. Then, By a complementary operation of the two groups of the electrodes, the signal charges (1), (3), (5) and (7) are transferred through the first transfer route, and the signal charges (2), (4), (6) and (8) are transferred through the second transfer route in parallel.

The structure of the sixth embodiment has an advantage that the signal charges can be readout only by means of the CCD transfer, which effectively reduce noises, especially when the sensor is cooled.

(Seventh Embodiment)

Figure 34:
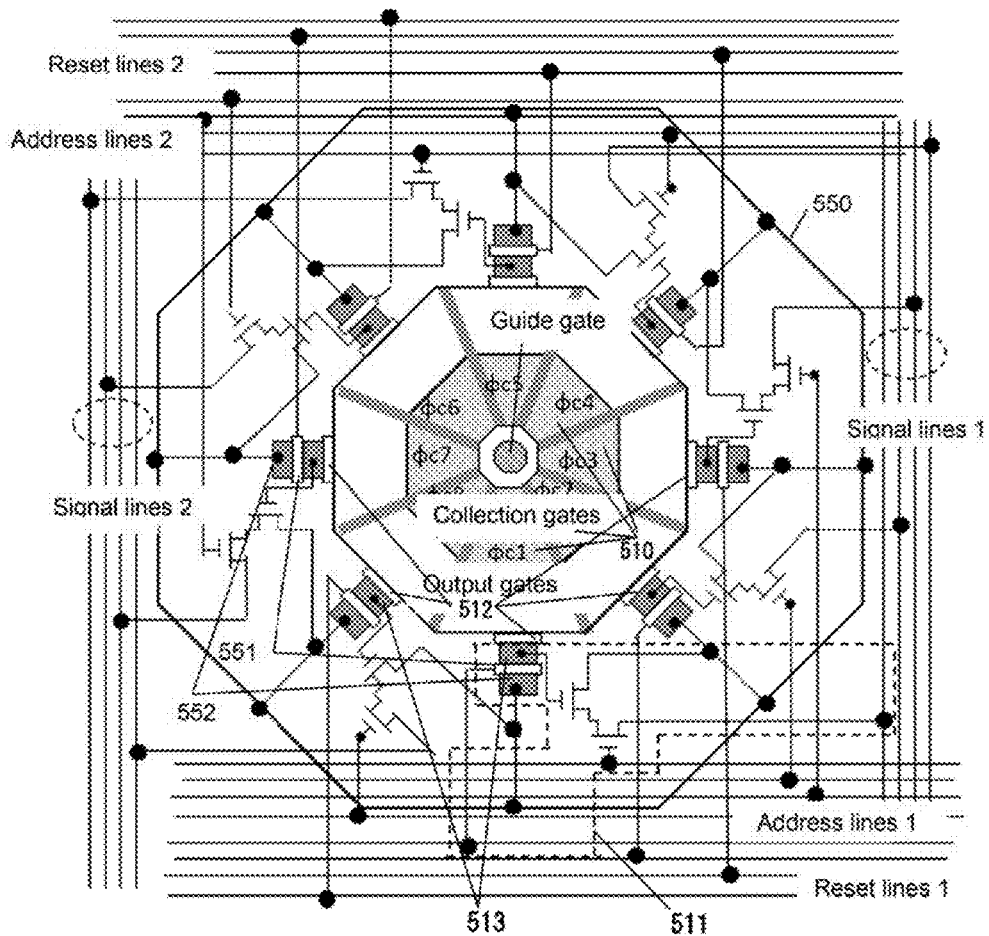
FIG. 34 is an explanatory view showing a plane structure of a seventh embodiment of this invention.

FIG. 34 is a plane view of a pixel of the seventh embodiment.

The embodiment is featured by that a CMOS circuit 511 transfers the image signals collected by the collection electrodes 510 to the CMOS memories (not drawn) in the outside of the photoreceptive area.

An output gate 512 is attached to each collection electrode. A FD (Floating Diffusion) 513 is attached to each output gate.

A voltage of the output gate is at a constant voltage VM between the high voltage VH and the low voltage VL of the collection electrodes.

When the voltage of one collection electrodes lowers from VH to VL after charge collection, the collected charges are transferred over a potential barrier at the output gate to the FD, converted to a voltage signal by the FD, and transferred to a CMOS memory outside the photoreceptive area.

The transfer by a CMOS circuit instead of a CCD has an advantage that circuits with higher functions, such as for reducing noises and for user's utilities, can be installed. The sensor disclosed in nonpatent literature 3 is an example of the sensors with higher functionalities.

On the other hand, a disadvantage of the CMOS transfer circuit is that amplification of the signals is necessary to compensate noise added during the transfer, which enlarges the analogue signal size stored in the second storage, and, thus, the area required for the second storage. In this invention, during image capturing, the signals are stored on the memory area on the image sensor chip. Therefore, the area allocatable to the memory is limited. One of the alternative countermeasures is reduction of a number of the consecutive frames or reduction of the amplification factor of the signals, which reduces SNR, must be considered.

On the other hand, the signal storage in the CCDs makes it possible in principle to completely transfer the signal charges as they are. Especially, a cooled CCD can transfer signals practically with no noise. After completion of image capturing, as the image signals stored in the sensor are read out of the sensor and stored in a buffer memory outside the sensor, the signals can be transferred after sufficient amplification.

Therefore, nonpatent literature 3 introduced an analogue signal record element made with a capacitor with a large capacity to increase the capacity per area by vertically combining a conventional CMOS capacitor and a capacitor made with a polysilicon electrode pair.

Instead of installing the memory area outside the photoreceptive area of the same chip, the memory area can be made on a second chip stacked to the backside of the sensor chip, in which the signals are transferred through wires vertical to the chip surface. Other circuits such as a power supply circuit can also be installed on the second chip.

(Eighth Embodiment)

Figure 35:
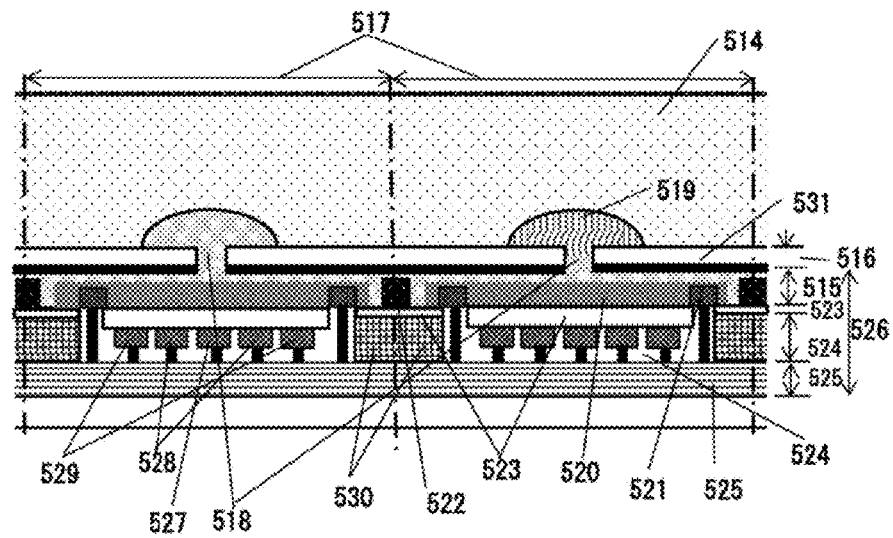
FIG. 35 is a cross-section view of an eighth embodiment of this invention.

FIG. 35 shows a cross section of the eighth embodiment. A thin high-concentration p-layer is formed at the backside. A charge generation layer 514 is a low concentration p-layer. The embodiment is featured by a first oxide insulation layer 516 sandwiched by the charge generation layer 514 and a charge collection layer 515, comprising a well-known SOI (Silicon-on-Insulator) structure.

The insulation layer 516 has a hole 518 at the center of each pixel 517. Around the hole, a low-concentration n layer 519 with a mushroom-like shape is formed to guide charges to the hole at the center.

The charge collection layer is a single-crystal low-concentration n layer. In the layer close to the front surface, a high-concentration n layer channel 520 is formed. A very-high-concentration n layer is formed for the Ohmic contact at the FD 521. The pixels are separated with high-concentration p-layer 522.

A second insulation layer 523 is made of oxide ($S_iO_2$). Metal wires are placed in a metal wire layer 525 is in the layer closer on the front surface. A circuit layer 526 comprises the charge collection layer 515, the second oxide layer 523, the electrode layer 524, and the metal wire layer 525.

The circuit layer has a structure similar to that of the seventh embodiment shown in FIG. 34. Since the operation voltage sequence is also similar, the detailed explanation is omitted.

In the case, however, an electrode at the center (the one right below the hole) is a guide electrode 527 instead of the drain. On both sides of the guide electrode (on a circle around the guide electrode in a plane view), the charge collection electrodes 528, the output gate electrodes 529 on the outside, the FD 521 on the further outside and the CMOS readout circuit 530 are placed.

Furthermore, a surface of the insulation layer is covered with a Tungsten light-shield layer 531 which almost completely prevent direct intrusion of incident light to the memory area.

Figure 36:
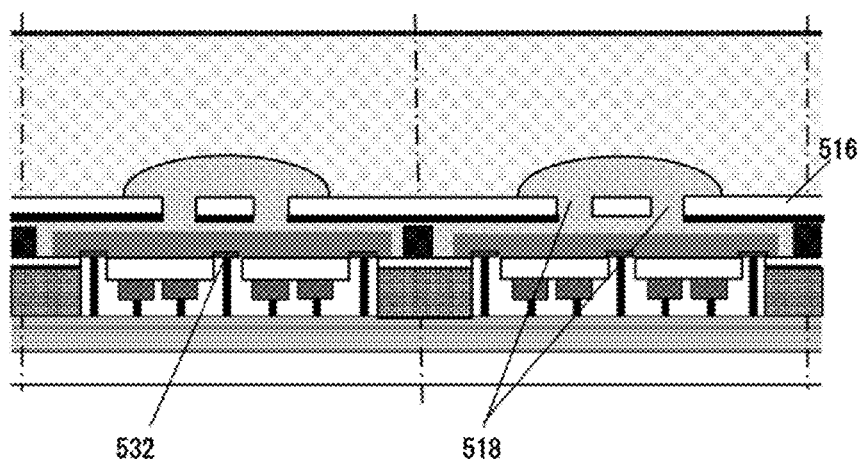
FIG. 36 is a cross-section view of an embodiment made with modification of the eighth embodiment.

FIG. 36 illustrates a modified embodiment of the eighth embodiment. The embodiment is featured by the holes 517 penetrating the insulation layer 516 to collect the signal charges above each charge collection electrode (eight holes on a circle around the drain 532 at the center).

(Ninth Embodiment)

Figure 37:
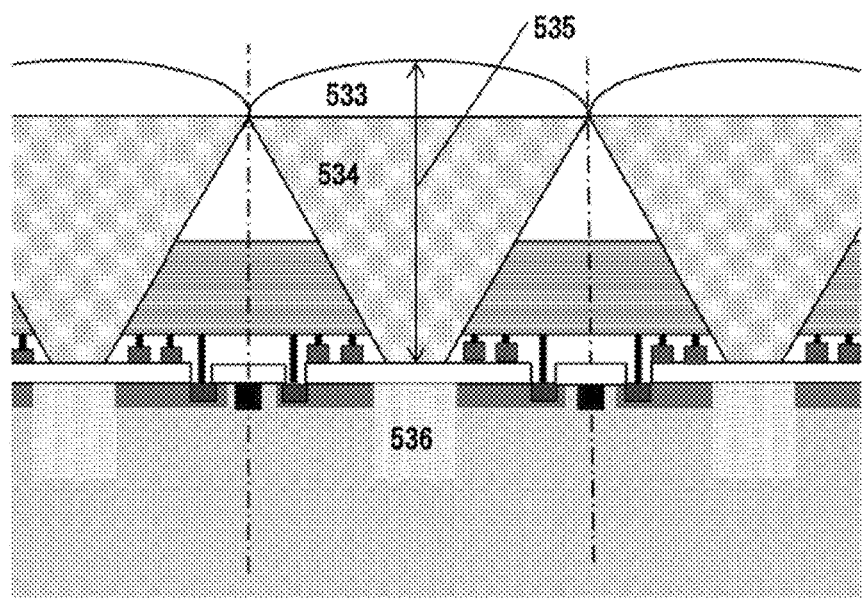
FIG. 37 is a cross-section view of a ninth embodiment of this invention.

FIG. 37 shows a cross section structure of a pixel of the ninth embodiment. The ninth embodiment is featured by that the embodiment is a front side illuminated image sensor with a stacked wave guide structure 535 composing microlens 533 and a light guide 534 on the front side. A photodiode 536 is formed under the light guide (at a central area of the pixel). Light incident on the front side is collected to a central part by the microlens and further concentrated to the pixel center by the wave guide.

A plane structure underneath the wave guide structure is similar to that of the seventh embodiment shown in FIG. 34.

The wave guide structure of the ninth embodiment converts most of the light incident to the pixel area to the signal charges.

Eight charge collection electrodes 528 encircle the photodiode. A high voltage VH applied to one of the charge collection electrodes collects signal charges under the collection electrode. Transfer and storage means are the same as those of the seventh embodiment.

The combination of the structure of the charge collection electrodes and the wave guide structure selectively and sequentially guides the signal charges generated by the light incident on the whole pixel area to one designated charge collection gate.

Means for transferring the signal charges collected by one of the eight charge collection electrodes "A" to a storage device belonging to A during collection of signal charges by the rest of the seven charge collection electrodes is the same as that of the seventh embodiment.

An advantage of the ninth embodiment is that the embodiment can be fabricated with a process to fabricate conventional front-side illuminated image sensors.

On the other hand, it is difficult to transfer the signal charges to the backside of a front-side illuminated image sensor such as the ninth embodiment. Therefore, it is difficult to install the signal charge storage on the second chip stacked to the first chip receiving light equipped with the photoelectron conversion device, the collection device of signal charges and the transfer device. It is also difficult to mount a power source circuit and the driver circuit on the second chip of each pixel or each pixel group to drive the charge collection device and the transfer device on the first chip.

It is also difficult to apply the embodiment to the sensor receiving ions instead of light.

(Tenth Embodiment)

Figure 38:
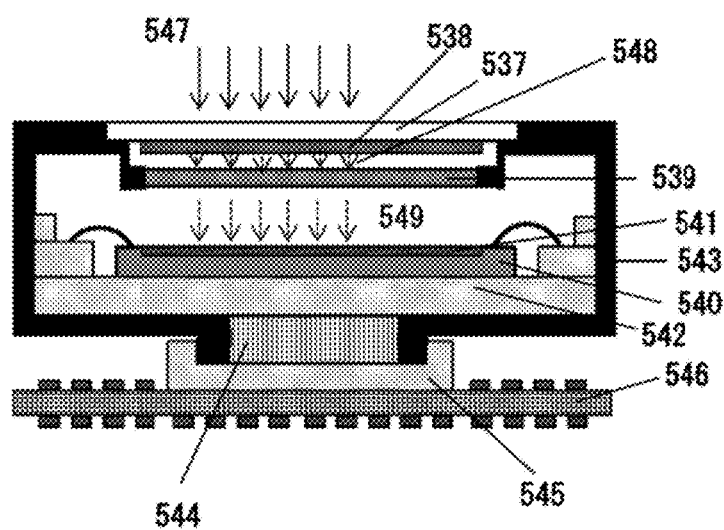
FIG. 38 is a cross-section view of a tenth embodiment of this invention.

The tenth embodiment introduces an electron multiplication device. The tenth embodiment shown in FIG. 38 utilizes an MCP (micro-channel plate) and an acceleration device of electrons, comprising an entrance window 537, a photoelectron conversion layer 538, an MCP 539, an image sensor 540, an photoreceptive surface 541 of the image sensor, a package 542, a vacuum chamber 543, terminal pins 544 connected to the inside of the vacuum chamber, a socket 545 receiving (inserted by) the pins and a circuit board 546.

The MCP receives an electron beam 548 generated by conversion of incident light 547 and multiplies the electron beam by electron multiplication, which are accelerated by a strong field applied to a space between an exit side of the MCP and a photoreceptive surface 541 of the image sensor. The photoreceptive surface receives the intensified electron beam 549, which further generates secondary electrons by impact ionization.

The MCP is not necessary. In the case, the signal is intensified by the impact ionization of the accelerated electron beam.

(Eleventh Embodiment)

The eleventh embodiment is featured by selective charge collection with transistors. Signal charges guided to the central area can be collected by one of charge collection electrodes by switching on and off of the transistors encircling the center. Though the structure has disadvantages such as a path of transfer charges being not depleted, it has advantages such as a gate voltage of the transistors can be less than 3 V. Furthermore, the CMOS circuitry can relatively easily introduces other functions such as amplifiers.

In the embodiment, selection transistors replace the charge collection gates 510 and the output gates 512 in FIG. 34 and eight address wires are added (the figure is omitted).

(Twelfth Embodiment)

The twelfth embodiment is featured by a floating diffusion functioning as a charge collection electrode. The embodiment is briefly explained with FIG. 34. Since the floating diffusion works as a double-function device collecting the signal charge, the twelfth embodiment is lacking the charge collection gates 510 and the output gates 512 in FIG. 34.

The charges are collected by one of the floating diffusions 513 to which a voltage higher than those applied to other floating diffusion is applied. To apply the higher voltage to the floating diffusion, the higher voltage is applied to the drain 552, keeping the reset gate 551 open. Then, signal charges continue to flow to the drain, keeping the floating diffusion at a constant potential. Then, the reset gate is closed and the signal charges continue to flow into the floating diffusion. If the charges are electrons, the potential of the floating diffusion continues to decrease. Therefore, CDS (correlated double sampling) can be applied to the twelfth embodiment by detecting the potential at a certain time after the closure of the reset gate.

The drain voltage is supplied from a ring-shaped wire 550 on the periphery of the pixel in FIG. 34. Therefore, the same voltage is applied to the eight drains. The twelfth embodiment requires eight wires to supply independently the voltages to the drains (not drawn).

The technologies explained above provides imaging apparatus achieving the theoretical highest frame rate (1/tc) fps or the practical highest frame rate (1/tt) fps a high sensitivity necessary for the ultra-high-speed imaging.

Imaging System

Figure 21:
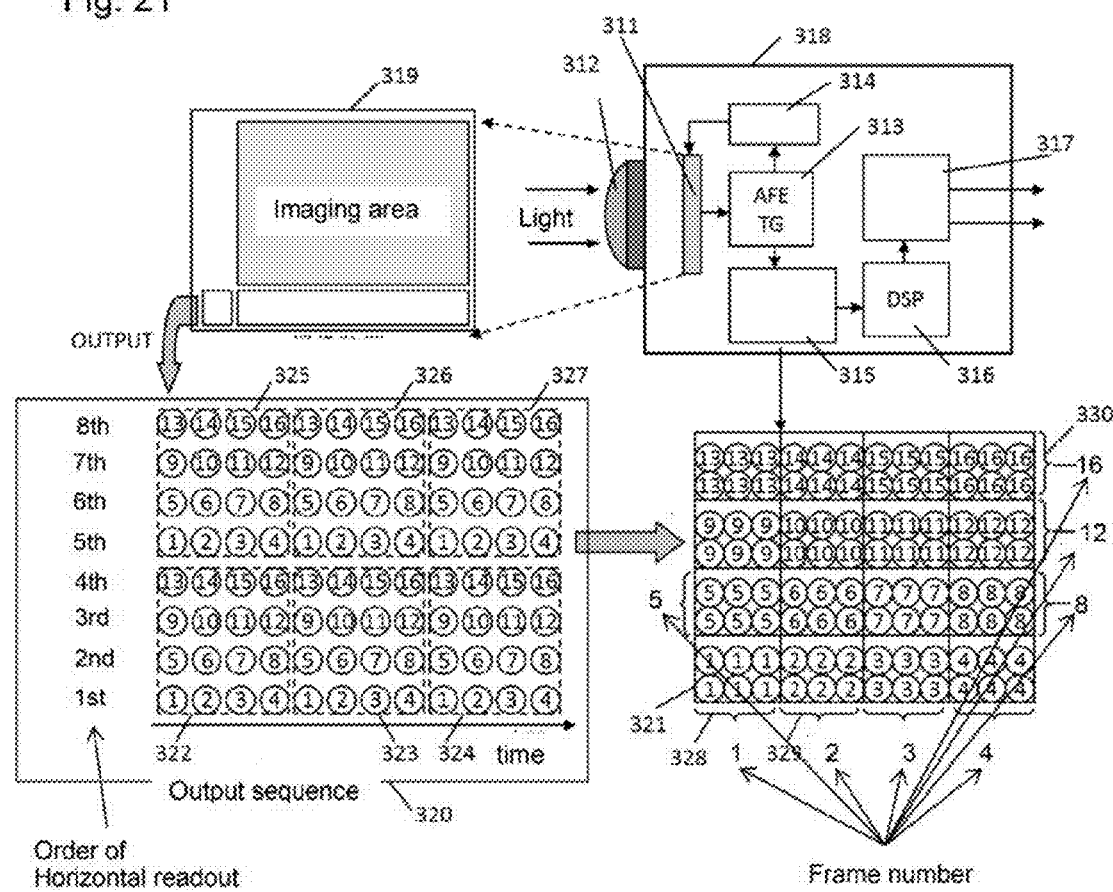
FIG. 21 shows a block diagram showing an imaging system with the imaging apparatus of this invention.

FIG. 21 shows a practical example of imaging apparatus (camera) of this invention comprising a solid-state imaging apparatus 311 of this invention, a lens system 312 focusing various imaging radiations (including visible light) on the solid-state imaging apparatus 311 (for light, a focusing optics), an AFE (analogue front-end) integrated circuit 313 including a control timing generation circuit (TG), an analogue processor (for example, a noise reduction CMOS circuit) of signals outputted from the imaging sensor, and an A/D converter to convert the signals to digital signals, and a driving circuit 314 to directly drive the imaging apparatus with operation control signals released from the AFE circuit.

However, if the driving circuit and the AFE circuit or the equivalents are installed in the imaging apparatus, such as in a CMOS image sensor with a digital output circuit, the AFE 313 and the driving circuit 314 are not necessary outside the image sensor.

The imaging sensor 311 is shown in an enlarged FIG. 319. A table 320 is an example time sequence of output signals from the first embodiment of this invention. The signals in groups surrounded by dotted lines 322, 323 and 324 are the signals captured in a first, a second and a third pixels on a first row. The sequence continues to the signals on the M-th column. The signals in the frames 325, 326 and 327 are those on a second row. The sequence for M pixels continues to the N-th row. Therefore, the M times N groups of image signals for M times N pixels, where each group includes 16 consecutive image signals (1) to (16), are finally read out. In this case, M=3, N=2, and M N=6.

The signals in the table 320 are transferred to a sorting device 315, and sorted as a sequence shown in a table 321. The signals in the groups 328, 329 and 330 in the table 321 respectively belong to a first, a second and a sixteenth frames, and each group contains image signals of M times N (3 times 2) pixels. The image signals sorted in this order are transferred to a digital signal processing circuit (DSP) 316.

The DSP 316 does the digital signal processing, such as filtering, interpolation and correlation process of signals between a pair of consecutive frames, and transfers the processed signals to a storage and display circuit block 317. Then, the image frames captured at (1/ti) fps are displayed in a slow motion.

Image sensor industry utilizes this invention for development of high-speed solid-state imaging devices and the operation modes. A high-speed cameras equipped with the sensor is widely used in advanced science and engineering.

What is claimed is:

1. An imaging apparatus comprising:
a semiconductor device;
a focusing unit for focusing an incident electromagnetic wave or an incident charged particle on the semiconductor device;
a controller for controlling the semiconductor device; and
a signal processing unit for processing a signal output from the semiconductor device,
wherein the semiconductor device includes an array of photo-sensitive units arranged in M columns and N rows, where M and N are integers equal to or greater than two, and each of the photo-sensitive units includes a conversion device for converting the incident electromagnetic wave or the incident charged particle to J electric charges, wherein J is an integer equal to or greater than zero, and m sub-units, where m is an integer equal to or greater than three,
each of the m sub-units includes at least one collection device for sequentially and selectively collecting the electric charges and storing the collected electric charges as a charge packet, and a transfer device for transferring the charge packet or a signal resulting from converting the charge packet to an outside of the sub-unit, and
the at least one collection device of each of the m sub-units is placed substantially along a circle of which a center is located at a central area of the photo-sensitive unit.

2. An imaging apparatus claimed as claim 1, wherein each of the m sub-units has an outer shape expanding substantially radially from the center of the circle at the central area of the photo-sensitive unit.

3. An imaging apparatus claimed as claim 1, wherein each of the photo-sensitive units further comprises a depleted path from the conversion device to the collection devices.

4. The imaging apparatus claimed as claim 1, wherein each of the sub-units further includes a second storage device, and means for transferring the charge packet collected by the collection device or the signal resulting from converting the charge packet to the second storage device during collection of the electric charges by the collection device of the other (m-1) sub-units.

5. The imaging apparatus claimed as claim 1, wherein the semiconductor device includes a first semiconductor layer extending along a first surface of the semiconductor device,
wherein the first semiconductor layer includes the conversion device of each of the photo-sensitive units, and
a second semiconductor layer extending along a second surface of the semiconductor device on an opposite side of the first surface of the semiconductor device,
wherein the second semiconductor layer includes the m sub-units of each of the photo-sensitive units,
the semiconductor device further includes a third layer in a space between the first semiconductor layer and the second semiconductor layer for guiding the electric charges generated in the conversion device in the first semiconductor layer to the collection device in one of the m sub-units in the second semiconductor layer, and the third layer is weakly preventive or non-existence in the central area of each of the photo-sensitive units so that the electric charges pass through the central area of the third layer of each of the photo-sensitive units at least when one of the collection devices is collecting the electric charges.

6. The imaging apparatus claimed as claim 1, wherein each of the photo-sensitive units includes an octagonal area having at least k sub-units, where k is an integer equal to or less than eight, and a square area including at least a device for transferring electric signals from the photo-sensitive unit into or out of the photo-sensitive unit, wherein the octagonal area and the square area have a common edge.

7. The imaging apparatus claimed as claim 1, wherein each of the photo-sensitive units in the semiconductor device includes a guide device over the each photo-sensitive unit for guiding the incident electromagnetic wave or the incident charged particle to the central area of the photo-sensitive unit.

* * * * *